(12) United States Patent
Shinkawata

(10) Patent No.: US 8,211,716 B2
(45) Date of Patent: Jul. 3, 2012

(54) MANUFACTURING METHOD OF A SEMICONDUCTOR DEVICE, A SEMICONDUCTOR WAFER, AND A TEST METHOD

(75) Inventor: Hiroki Shinkawata, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 758 days.

(21) Appl. No.: 12/403,616

(22) Filed: Mar. 13, 2009

(65) Prior Publication Data

US 2009/0243645 A1    Oct. 1, 2009

(30) Foreign Application Priority Data

Mar. 27, 2008   (JP) ................... 2008-084460

(51) Int. Cl.
*H01L 21/00* (2006.01)
(52) U.S. Cl. .................. 438/14; 257/E21.524
(58) Field of Classification Search .......... 438/14, 438/11, 12; 257/E21.524
See application file for complete search history.

(56) References Cited

U.S. PATENT DOCUMENTS

| | | |
|---|---|---|
| 7,768,004 B2 | 8/2010 | Shintaku |
| 8,115,500 B2 * | 2/2012 | Doong et al. ............ 324/687 |
| 2002/0149120 A1 * | 10/2002 | Sugiyama ............ 257/786 |
| 2004/0183556 A1 * | 9/2004 | Wada et al. ............ 324/754 |
| 2008/0026490 A1 * | 1/2008 | Asano et al. ............ 438/14 |

FOREIGN PATENT DOCUMENTS

| | | |
|---|---|---|
| JP | 4-4754 U | 1/1992 |
| JP | 5-074882 A | 3/1993 |
| JP | 9-199565 A | 7/1997 |
| JP | 2002-313864 A | 10/2002 |
| JP | 2003-332397 A | 11/2003 |
| JP | 2004-146415 A | 5/2004 |
| JP | 2006-120962 A | 5/2006 |

OTHER PUBLICATIONS

Notification of Reasons for Refusal issued Mar. 21, 2012, in Japanese Application No. 2008-084460.

* cited by examiner

*Primary Examiner* — Thao P. Le
(74) *Attorney, Agent, or Firm* — Miles & Stockbridge P.C.

(57) ABSTRACT

The present invention aims to increase the number of test elements of a TEG without increasing the area of each of slice areas. Test electrode pads are disposed in alignment in one row in each of areas separated from semiconductor chips provided over a semiconductor wafer. Test elements are formed corresponding to these test electrode pads and in areas lying directly therebelow. Electrode terminals of the test elements are electrically coupled to the test electrode pads adjacent to the corresponding electrode pads and the test electrode pads further adjacent thereto with being spaced one test electrode pad apart. Upon testing, probe pins are brought into contact with the odd-numbered test electrode pads to conduct testing. Next, the probe pins are brought into contact with the even-numbered test electrode pads while being shifted by one electrode pad pitch thereby to conduct testing.

16 Claims, 18 Drawing Sheets

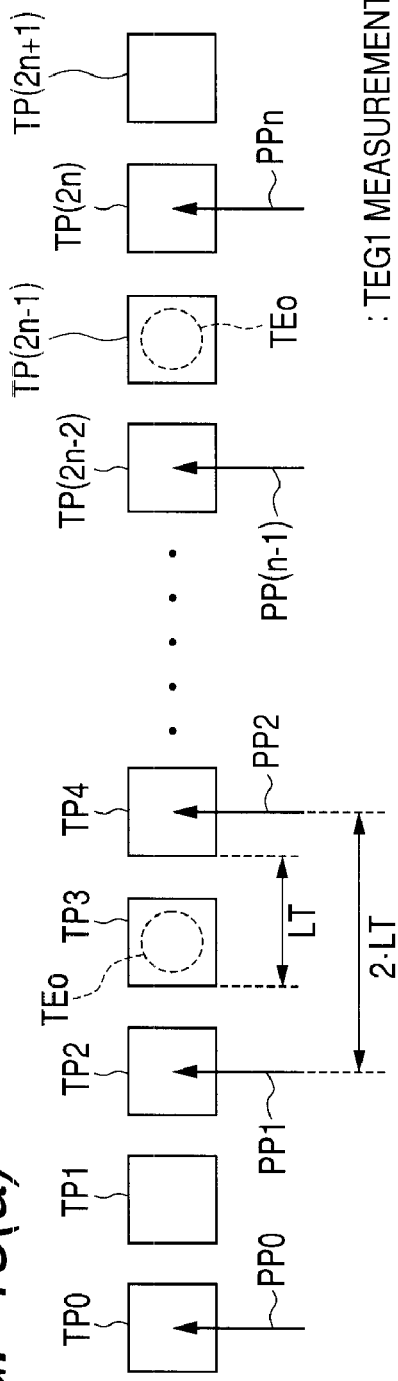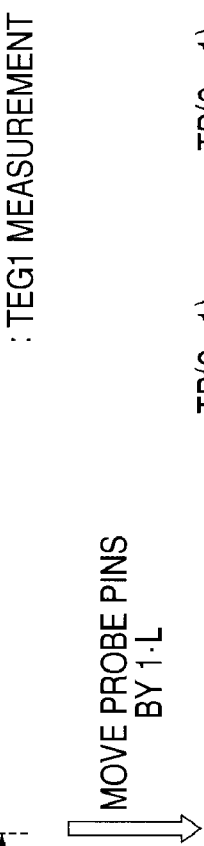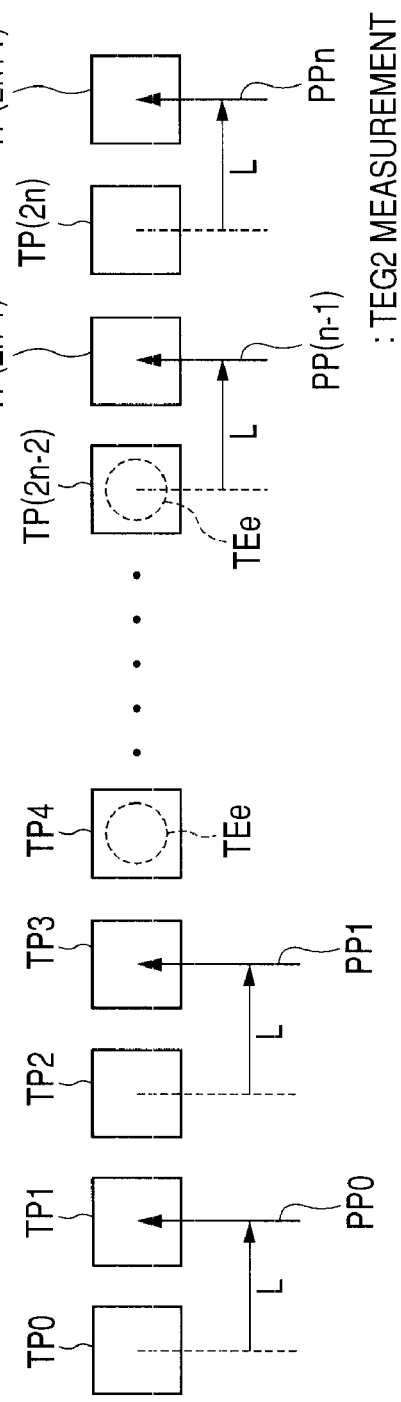

MANUFACTURING METHOD OF A SEMICONDUCTOR DEVICE, A SEMICONDUCTOR WAFER, AND A TEST METHOD

CROSS-REFERENCE TO RELATED APPLICATIONS

The disclosure of Japanese Patent Application No. 2008-84460 filed on Mar. 27, 2008 including the specification, drawings and abstract is incorporated herein by reference in its entirety.

BACKGROUND OF THE INVENTION

The present invention relates to a configuration for efficiently laying out test elements for testing a semiconductor device at a semiconductor wafer level, and a test method using the test elements.

A TEG (Test Element Group) is used to ensure the reliability of a semiconductor device such as an integrated circuit. The evaluation of a process, circuit characteristics and reliability is performed by a characteristic evaluation (test) using the TEG. At the stage of product development, a reliability evaluation is conducted based on the result of measurement using the TEG, and a process or circuit design is modified or corrected based on the so-obtained result of evaluation. As to actual products, the reliability of each semiconductor device is evaluated to determine whether each of the produces is good.

Normally, electrical characteristic management TEGs are respectively disposed in scribed areas lying on a semiconductor wafer. Scribed lines for separating semiconductor chips individually are placed in the scribe areas respectively. Unless otherwise specified in particular, the scribe areas and the scribe lines are used in the same meaning in the following description. Further, unless otherwise specified in particular, slice lines and shut areas are also used in the same meaning as the scribe areas. Superimposition detection marks for mask alignment at a manufacturing process, thickness monitor marks and the like are also disposed in the scribe areas in large numbers except for the TEG.

With recent high integration in particular, there has been a tendency that the type of each utilized transistor and the number of wiring layers also increase and the numbers of superimposition marks and thickness monitoring marks increase. In the transistors, wirings and vias or the like increase, device's evaluation items to be managed increase, and the number of test elements for each TEG also increases correspondingly. There have heretofore been proposed various configurations/layouts for efficiently laying out such TEGs.

In a patent document 1 (Japanese Unexamined Patent Publication No. 2002-313864), electrode pads for TEG elements are disposed in scribe areas (scribe lines) respectively. TEGs are respectively disposed below electrode pads lying on semiconductor chips in alignment with the elected pads. As another embodiment, TEG elements are disposed in a layer below test electrode pads in association with the test electrode pads at the scribe lines. The TEG elements are of three-terminal elements. Three test electrode pads are disposed corresponding to the respective TEG elements. The TEG elements are electrically coupled to their corresponding test electrode pads. The layout area of each TEG is reduced by laying out the electrode pads and the TEG elements in overlaid form.

In a patent document 2 (Japanese Unexamined Patent Publication No. Hei 9 (1997)-199565), test electrode pads are disposed in a scribe area in zigzag form, and a test transistor is disposed below one test electrode pad layout area. The test transistor is of a four-terminal element. Four test electrode pads are disposed adjacent to each other corresponding to one test transistor. A control gate, a back gate, a source terminal and a drain terminal of the test transistor are electrically coupled to the four test electrode pads respectively disposed corresponding thereto.

In the patent document 2, the test electrode pads are disposed in each scribe area (scribe line) in zigzag form thereby to reduce the pitch between the test electrode pads and suppress an increase in the layout area of each test electrode pad. The test elements and the test electrode pads are disposed in superimposed form thereby to lay out a number of TEG elements on their corresponding scribe lines.

In a patent document 3 (Japanese Unexamined Patent Publication No. 2003-332397), test electrode pads are respectively placed in scribe lines so as to overlap with coupling metal wirings of test elements. Active regions of transistors that configure the test elements are alternately disposed in alignment with the test electrode pads and so as not to overlap therewith. The wirings for the test elements are disposed so as not to overlap with the electrode pads, thereby attaining the narrowing of the width of each scribe line.

When such TEG elements are disposed in large numbers, the pitch between the TEG elements becomes small. Hence, the interval between test probes also needs to be narrowed. Even when the pitch between such TEG elements becomes small, the reliable contact of the test probes with the test electrode pads is required to conduct high-reliable measurements.

A configuration aimed to bring such test probes into contact with the test electrode pads reliably has been described in a patent document 4 (Japanese Patent Publication No. Hei 5 (1993)-74882). In the configuration shown in the patent document 4, the test electrode pads are disposed around each semiconductor chip in alignment. Upon testing, test probe pins each having a pitch equal to twice the pitch between chip electrode pads is used. In this case, the test probe pins are divided into probe pins arranged in even-numbered electrode pads with respect to one chip, and probe pins coupled to odd-numbered electrode pads at each adjoining chip. After the completion of one test process, a probe card is moved by one chip on a semiconductor wafer, and the next test is executed. Thus, a test using the even-numbered test electrode pads is performed on one semiconductor chip. Then, a test using odd-numbered test electrode pads is performed thereon.

The patent document 4 aims to make the pitch between the test probe pins wider than the pitch between the electrode pads thereby to obtain the following advantageous effects. Even if wide probe pins each having rigidity are utilized, the contact between the probe pins can be avoided. Since the rigid probe pins are available, accurate measurements can be reliably made by causing the probe pins to contact their corresponding test electrode pads.

In a patent document 5 (Japanese Unexamined Patent Publication No. 2004-146415), a test probe card having a pin pitch equal to twice the pitch between test electrode pads is used. Testing is implemented while probe pins are being shifted by a test electrode pitch. The test electrode pads are disposed on a semiconductor chip in alignment. The patent document 5 aims to avoid that the pitch between pins of the test probe card becomes narrow, even in the case where the pitch between the test electrode pads becomes narrow.

In a patent document 6 (Japanese Utility Model Laid-Open No. Hei 4 (1992)-4754), testing is implemented while pins of a probe card are being brought into contact with alternate electrode pads lying on a semiconductor device. Each of input electrode pads is made larger than an output electrode pad in its layout area. In the probe card, probe pins are disposed with a pitch equal to twice the output electrode pads. Even when the probe pins are moved to their corresponding adjoining output electrode pads, the same voltage is applied to the input electrode pads. The patent document 6 aims to relax a condition for the pitch between the probe pins even when the pitch between the electrode pad rows becomes small.

SUMMARY OF THE INVENTION

It is desired that a chip size is set as small as possible in terms of cost. Thus, when the chip size is constant, each scribe area does not increase in area. In a leading-edge semiconductor device such as a system-on-chip (SoC), however, test management items increase as mentioned above. Further, the number of marks for superimposition detection/inspection or thickness monitoring increases, and the number of elements/members disposed in scribe areas increases. Thus, the layout of all required management items in the scribe areas needs to lay out TEGs efficiently.

In the patent document 1 referred to above, the electrode pads for the TEG elements are placed in the areas for the scribe lines respectively. In this placement, the three test electrode pads are disposed with respect to one TEG element. The TEG element is disposed in the layer below these corresponding three test electrode pads. In the patent document 1, however, each test electrode pad is placed in a vertex position of a triangle. Consequently, the test electrode pads are placed in two rows along the direction in which the scribe lines extend, and the width of each scribe line cannot be narrowed. Although the pitch between the test electrode pads becomes small, the relationship between the pitch between the probe pins and the pitch between the test electrode pads is not taken into consideration, and no consideration is taken as to how testing is conducted while bringing the probe pins into contact with the test electrode pads.

In the configuration shown in the patent document 2, the test electrode pads are placed in the scribe areas in zigzag form respectively. Thus, although the test electrode pads can be disposed in high density along the direction in which the scribe lines extend, in the case of the configuration shown in the patent document 2, it is not possible to narrow the width of each scribe line. One test transistor element is disposed corresponding to the four test electrode pads disposed adjacent to one another to electrically couple the test transistor and the electrode pads. Thus, when the test electrode pads are placed in each scribe area in high density, it becomes difficult to cause the test probe pins to make contact with their corresponding test electrode pads where its pitch condition becomes severe. The patent document 2 simply aims to reduce the pitch between the test electrode pads and does not take into consideration the relationship between the pitch between the probe pins and the pitch between the electrode pads.

In the configuration shown in the patent document 3, the active regions that configure the test electrode pads and the test transistor elements are alternately disposed in the scribe areas. Thus, a problem arises in that the test electrode pads cannot be disposed in high density, and adaptation to an increase in management item cannot be done. The patent document 3 does not show how the test transistor elements and their corresponding test electrode pads couple.

In the patent document 4, the pitch between the probe pins of the probe card is set to the pitch equal to twice the pith between the output pads disposed around each semiconductor chip. The probe pins are coupled to the alternate even-numbered output pads, for example, of one semiconductor chip between the adjacent semiconductor chips. At the other semiconductor chip, the probe pines are coupled to other alternate odd-numbered output pads, for example. Upon testing, the test on the alternate output pads is performed at the respective pads. Then, each test probe is moved by one chip to cause the test probe pins to contact their corresponding non-contact output pads of the semiconductor chip, thereby performing a test.

Namely, the patent document 4 shows the placement or layout of the probe pints with respect to the output pads, power pads and control signal input pads disposed around each semiconductor chip. The patent document 4 does not show the configuration in which the output electrode pads are disposed in their corresponding scribe areas of the semiconductor wafer. In the patent document 4, a shift register and a latch are disposed at each output pad, and the output pads are laid out in accordance with their output signals. Thus, when the test electrode pads are disposed in their corresponding scribe areas when drivers disposed corresponding to the output pads are taken as TEG elements, there is a need to place the test electrode pads and the TEG elements in discrete areas. Accordingly, the configuration shown in the patent document 4 cannot be applied to the configuration of the test electrode pads disposed on the scribe lines as it is.

In the configuration shown in the patent document 5, the pitch between input/output pads disposed around each liquid crystal driver is also set to a relationship of 1:2. The width of each input pad is set to twice the width of each output pad. The pitch between the probe pins is four times that of the output pad and identical to the input pad. The input pad has a pitch equal to twice that of the output pad. The probe pins are brought into contact with the same input pad while the probe pins are respectively shifted by the pitch of each output pad, thereby performing a test.

In the patent document 5, a reduction in the pitch between the probe pins is suppressed using the fact that the output and input pads are different in pitch. However, each of the probe pins is merely brought into contact with the output pad every four pads. There is a need to move each probe pin four times in order to test all the output pads. Hence, the number of test processes increases. The patent document 5 merely shows the layout of the output pads that output internal signals, on each semiconductor chip. No consideration is given to the layout of the TEG elements dedicated for testing and the test electrode pads.

In the patent document 6, the probe pins are brought into contact with the input/output pads disposed around each semiconductor chip to conduct a test. In a manner similar to the configuration shown in the patent document 5 even in the patent document 6, the pitch conditions for the input and output pads are changed and the probe pins are disposed with the pitch equal to twice that of the output pad. Upon testing, the test is conducted while the probe pin is being shifted by the pitch of the output pad. Even in the patent document 6, the pitch conditions for the input and output pads disposed around each semiconductor chip are made different from each other, and the narrowing of the pitch between the probe pins is suppressed. However, the patent document 6 takes into no consideration the layout of the test electrode pads at the placement of the test-dedicated TEG, on the scribe areas or the semiconductor chip where the test-dedicated TEG elements and the test electrode pads are disposed. The patent document 6 takes into no consideration the relationship of position between the test probe and the test electrode pads where all the test electrode pads are placed with the same pitch and the relationship of position between the test electrode pads and the TEG elements, and wirings.

Therefore, an object of the present invention is to provide a method for manufacturing a semiconductor device, which is capable of improving the efficiency of placement of a TEG with no change in the conventional measurement environment, a semiconductor wafer generated by the method, and a method for testing the semiconductor wafer.

In the present invention, test electrode pads are disposed in predetermined areas in alignment in one row. Test elements are respectively formed in areas directly below the test electrode pads. The test elements are electrically coupled to their corresponding electrode pads adjacent to the test electrode pads lying directly thereabove.

Preferably, the adjoining test elements are electrically coupled to their corresponding adjoining test electrode pads by wirings different in wiring layer.

A manufacturing method of a semiconductor device according to the present invention comprises the steps of forming a plurality of test elements in alignment in one row in predetermined areas positioned in areas different from semiconductor chips formed with target circuit devices lying over a semiconductor wafer, disposing test electrode pads in alignment in one row in layers above the test elements and so as to overlap with the test elements, and electrically coupling the test elements to the corresponding test electrode pads each adjacent to both sides of the test electrode pad placed directly above the test element.

The semiconductor wafer according to the present invention is of a semiconductor wafer including the test elements and test electrode pads formed by the above manufacturing method as one embodiment.

A test method according to the present invention is of a method for conducting a test on the semiconductor wafer formed by the semiconductor device manufacturing method according to the present invention as one embodiment. The method includes the steps of causing test probe pins to make contact with the alternate electrode pads of the test electrode pads and performing transmission/reception of an electric signal between a tester and the alternate electrode pads thereby to conduct a test, and causing the test probe pins to make contact with the corresponding test electrode pads with being shifted by one pitch between the test electrode pads and performing transmission/reception of an electric signal between the tester and the electrode pads brought into contact therewith thereby to conduct a test.

A test structure according to the present invention includes a plurality of test electrode pads disposed in alignment in one row, and a plurality of test elements disposed in alignment with the test electrode pads and so as to correspond thereto in one embodiment. These test elements are formed with corresponding electrode pad overlaps so as to overlap with their corresponding test electrode pads. The test elements different from each other are disposed so as to be electrically coupled to the adjoining electrode pads of the test electrode pads, and the respective test elements are disposed so as to be coupled to the test electrode pads different from the corresponding test electrode pads.

Another test method according to the present invention is provided as one embodiment showing a structure wherein in the test structure according to the present invention, the adjoining test elements disposed corresponding to the adjoining test electrode pads are alternately electrically coupled to the test electrode pads disposed continuously at the test electrode pads. In the present structure, probe pins are brought into contact with their corresponding alternately-disposed test electrode pads of the test electrode pads thereby to implement testing. Then, the probe pins and the test electrode pads are brought into contact with one another with being spaced one test electrode pad apart thereby to conduct testing.

According to the present invention, test electrode pads and test elements are disposed so as to overlap. It is thus possible to dispose these test electrode pads and test elements in high density and place a number of test elements without causing an increase in the layout area of each test element. The test elements are electrically coupled to their corresponding test electrode pads adjacent to the test electrode pads lying directly thereabove. Thus, since upon testing, no test elements exist below the test electrode pads with which the probe pins make contact, testing can be done accurately without exerting an influence such as stress on each test element.

Upon testing, probe pins are brought into contact with alternate test electrode pads to implement testing. Then, testing is done while each test probe pin is being shifted by one test electrode pad pitch. Thus, the pitch between the probe pins is a pitch equal to twice the pitch between the test electrode pads. The pitch between the probe pins can be ensured sufficiently and testing can be done using a probe pin layout or configuration similar to the conventional one.

BRIEF DESCRIPTION OF THE DRAWINGS

FIG. 13 is a diagram schematically showing layouts of probe pins and test electrode pads at a test process shown in FIG. 12;

DETAILED DESCRIPTION OF THE PREFERRED EMBODIMENTS

First Preferred Embodiment

Figure 1:
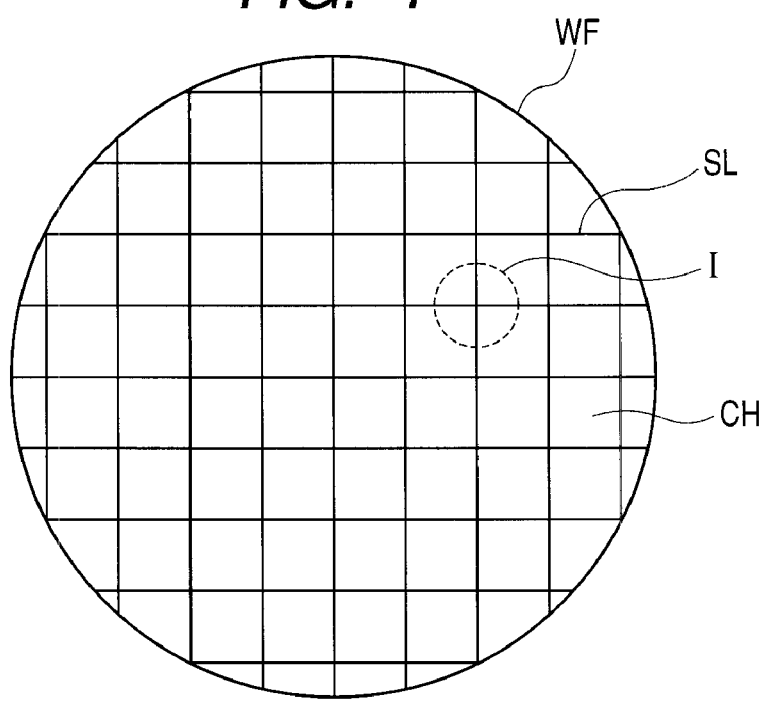
FIG. 1 is a diagram schematically showing a chip layout on a semiconductor wafer according to a first preferred embodiment of the present invention.

FIG. 1 is a diagram schematically showing a chip layout of a semiconductor wafer WF according to a first preferred embodiment of the present invention. In FIG. 1, a plurality of semiconductor chips CH are arranged over the semiconductor wafer WF in array form. Target semiconductor circuit devices are formed over these semiconductor chips CH. Scribe lines SL are formed to separate these semiconductor chips CH individually and mount or implement them in a package. After a wafer test process has been completed, the semiconductor chips CH formed over the semiconductor wafer WF are individually separated from one another by performing their dicing along the scribe lines SL. As will be described in detail later, test elements and test electrode pads that configure each TEG are placed in alignment in a signal row within areas with the scribe lines SL formed therein.

Figure 2:
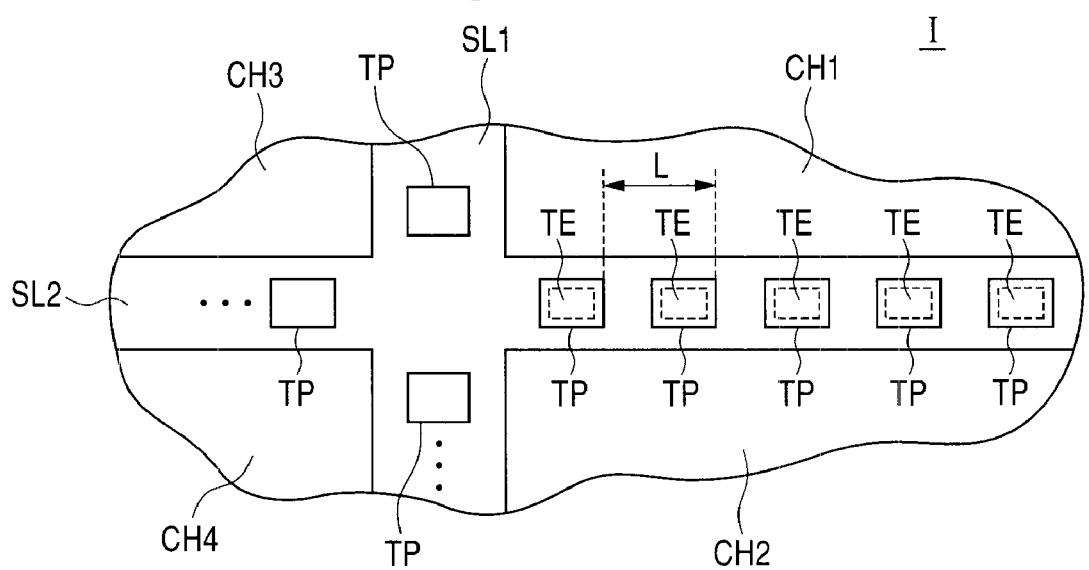
FIG. 2 is a diagram illustrating, in enlarged form, part of the semiconductor wafer shown in FIG. 1.

FIG. 2 is a diagram showing, in enlarged form, a broken-line area I lying over the semiconductor wafer WF shown in FIG. 1. In FIG. 2, semiconductor chips CH1 through CH4 are disposed opposite to one another through scribe lines SL1 and SL2 interposed therebetween respectively. The scribe lines SL1 and SL2 are disposed so as to separate the semiconductor chips CH1 through CH4 from one another and to intersect with one another.

While TEGs are placed in the scribe lines SL1 and SL2, a layout of a TEG lying in a scribed area formed between the semiconductor chips CH1 and CH2 is typically shown in FIG. 2. In the scribe area formed between the semiconductor chips CH1 and CH2, test electrode pads TP and test elements TE are placed so as to overlap with each other in alignment and as viewed on a plan-figure basis. The test electrode pads TP are placed in alignment in a single row at predetermined pitches L along the direction in which the scribe line SL2 extends. In FIG. 2, the test elements TE are shown so as to be placed below the test electrode pads TP respectively. However, the test elements TE may be laid out as one with respect to a predetermined number of test electrode pads.

Laying out the test elements TE below the test electrode pads TP so as to overlap with each other makes it possible to place the double test electrode pads and test elements with no increase in area as compared with the case in which the test elements and the test electrode pads are alternately placed in a plan layout. At the same time, the number of test patterns for the TEG can be increased (the number of test elements can be increased and management or control items can be increased).

In FIG. 2, a TEG is placed even in the scribe line SL1, and a TEG is placed even in an area for the scribe line SL2 provided between the semiconductor chips CH3 and CH4. A test electrode pad 1 is typically shown in these areas. TEGs are disposed in the areas for the scribe lines SL in association with the respective semiconductor chips CH respectively.

Figure 3:
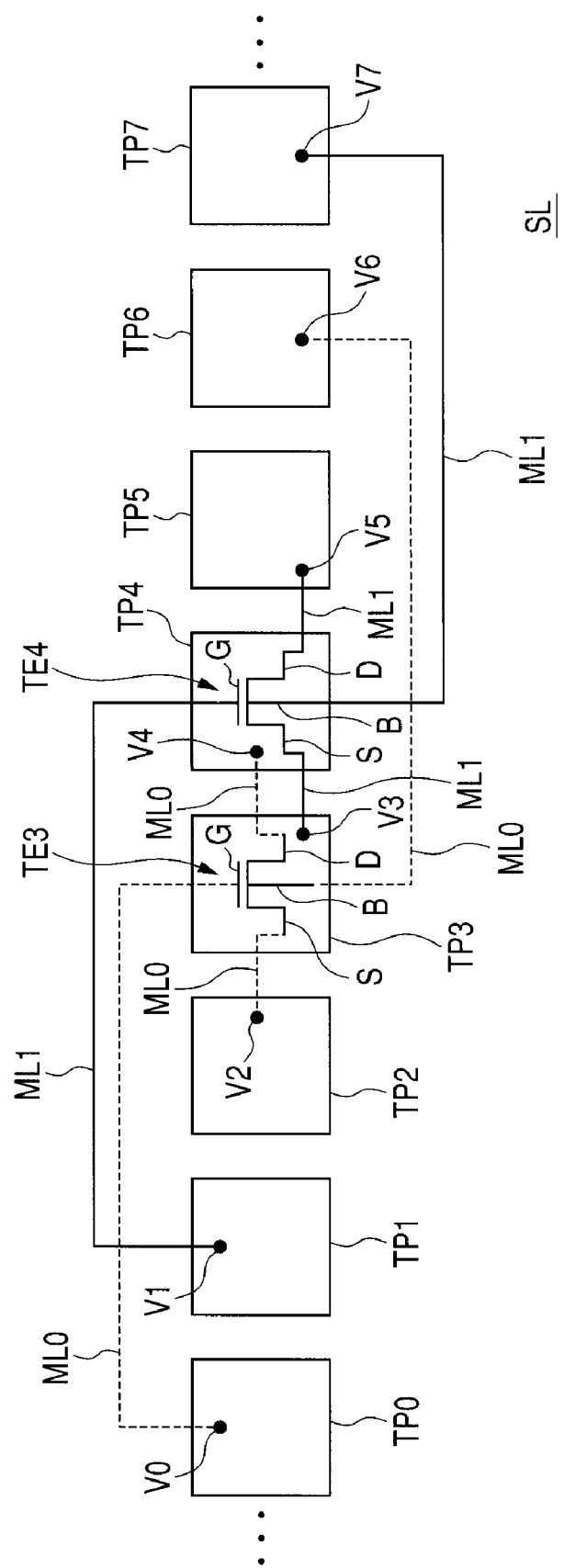
FIG. 3 is a diagram schematically showing a layout of a TEG according to the first preferred embodiment of the present invention.

FIG. 3 is a diagram showing one example of a layout of a TEG. In FIG. 3, test electrode pads TP0 through TP7 are placed in alignment in a signal row. Test elements TE are respectively placed below the test electrode pads TP0 through TP7. Test elements TE3 and TE4 formed in areas lying directly below the test electrode pads TP3 and TP4 are typically shown in FIG. 3. As these test elements TE3 and TE4, MOS transistors (insulated gate field effect transistors) are used by way of example. Each of the MOS transistors is of a four-terminal element and has a source terminal S, a drain terminal D, a control gate terminal G and a back gate terminal B.

The test element TE3 has a control gate terminal G electrically coupled to the test electrode pad TP0 through a first metal wiring ML0 and a via V0, a source terminal S coupled to the adjoining test electrode pad TP2 through the first metal wiring ML0 and a via V2, a drain terminal D electrically coupled to the adjoining test electrode pad TP4 through the first metal wiring ML0 and a via V4, and a back gate terminal B electrically coupled to the test electrode pad TP6 through the first metal wiring ML0 and a via V6.

The test element TE4 has a control gate terminal G electrically coupled to the test electrode pad TP1 through a second metal wiring ML1 and a via V1, a source terminal S electrically coupled to the adjoining test electrode pad TP3 through the second metal wiring ML1 and a via V3, a drain terminal D electrically coupled to the adjoining test electrode pad TP5 through the second metal wiring ML1 and a via V5, and a back gate terminal B electrically coupled to the test electrode pad TP4 through the second metal wiring ML1 and a via V7.

The metal wirings ML0 and ML1 are of wirings different in wiring layer. For example, the first metal wiring ML0 is a wiring of a first-layer metal wiring layer and the second metal wiring is a wiring of a second-layer metal wiring layer corresponding to an upper layer.

As shown in FIG. 3, one test element TE (TE3 or TE4) is coupled to its adjoining electrode pads and further coupled to test electrode pads adjacent to the adjoining test electrode pads with respectively one test electrode pad interposed therebetween. Thus, each test element TE is electrically coupled to a test electrode pad group with even numbers or a test electrode pad group with odd numbers in a test electrode pad row.

The first metal wiring ML0 and the second metal wiring ML1 are of wirings different in wiring layer. By making electrical coupling between the adjacent test electrode pads and the test element TE using the wirings different in wiring layer, electrical coupling to the adjoining test electrode pads can be formed in avoidance of wiring's collisions.

Figure 4:
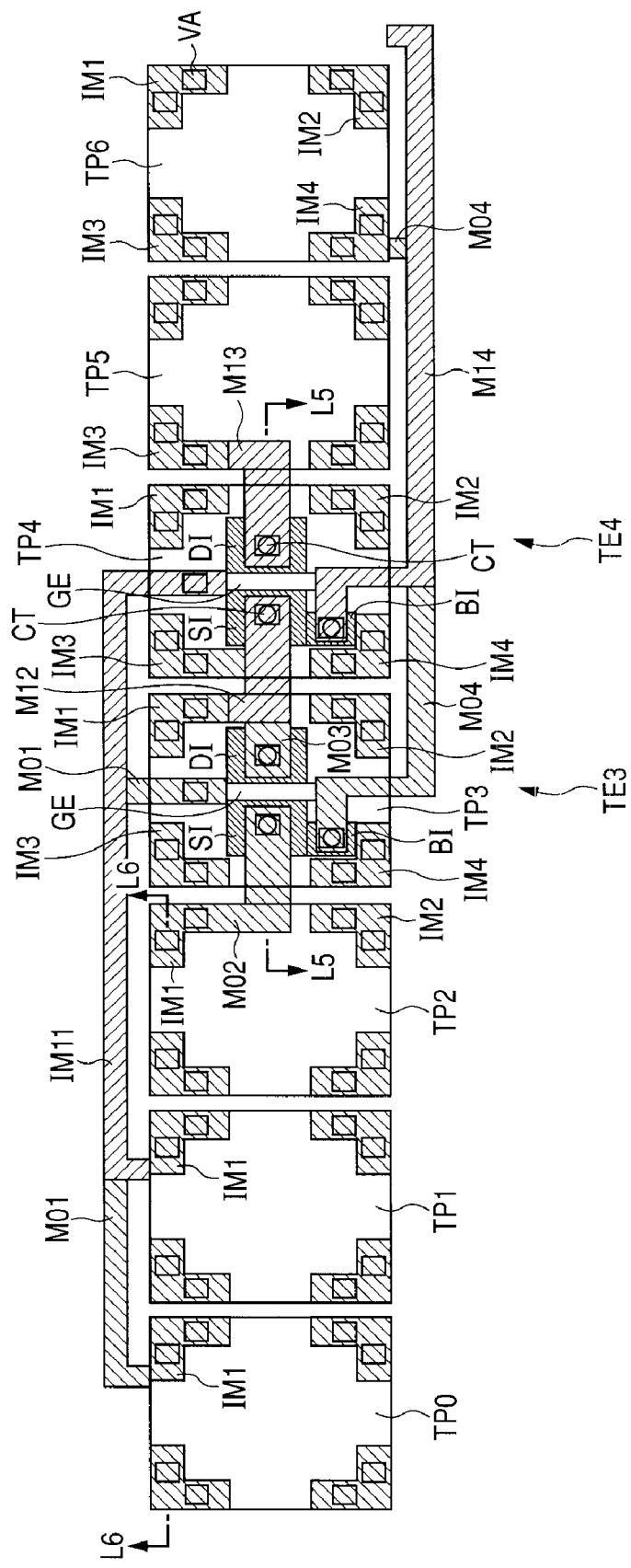
FIG. 4 is a diagram schematically illustrating a plan layout of the TEG according to the first preferred embodiment of the present invention.

FIG. 4 is a diagram showing a schematic plan layout of the TEG shown in FIG. 3. Test electrode pads TP0 through TP6 are disposed in FIG. 4. First-layer island-like metal portions IM1 through IM4 are disposed corresponding to these test electrode pads TP0 through TP6 as intermediate wirings for contact. These first-layer island-like metal portions IM1 through IM4 are separated from one another and wirings can be placed through between these.

Each of the first-layer island-like metal portions IM1 through IM4 is formed in the same process as a process for manufacturing the wiring of the first-layer metal wiring layer employed in a semiconductor device formed over a semiconductor chip. While the test electrode pads are respectively provided with island-like metal portions in association with the respective wiring layers on the semiconductor chip, the island-like metal portions formed in the first-layer metal wiring layer are typically shown in FIG. 4.

Vias VA are respectively provided corresponding to the island-like metal portions IM1 through IM4. The vias VA contain both through holes and a conductive material with which the through holes are filled. It is thus possible to couple the wiring provided in each wiring layer to its corresponding island-like metal portion and further electrically couple the same to the top-layer test electrode pad via the island-like metal portion disposed in an upper layer. These first-layer island-like metal portions are formed in the same layout at the test electrode pads. Thus, the first-layer island-like metal portions corresponding to the test electrode pads are designated at the same reference numerals.

Each of the test elements TE3 and TE4 is of a four-terminal transistor (MOS transistor) as shown in FIG. 3. The four-terminal transistor is formed in an active area lying over a semiconductor substrate area. The active area includes a source impurity region SI, a drain impurity region DI and a backgate electrode drawing impurity region (backgate impurity region) BI. These impurity regions SI, DI and BI are of low resistance regions. A bias voltage is supplied to a substrate area (backgate) formed with each transistor via the backgate impurity region BI.

A gate electrode GE is formed between the source impurity region SI and the drain impurity region DI. A source terminal S, a drain terminal D and a backgate terminal B respectively comprise the impurity regions SI, DI and BI and their corresponding contacts CT.

The gate electrode GE is formed of polysilicon lying below the corresponding metal wiring and electrically coupled to its corresponding gate electrode wiring (metal wiring) through the via VA formed in the gate electrode drawing region.

In the test element TE3, the gate electrode GE thereof is electrically coupled to its corresponding first-layer metal wiring M01 through the via VA. The first-layer metal wiring M01 to which the gate electrode GE is coupled passes through a region defined between the island-like metal portions IM1 and IM3 provided for the test electrode pad TP3 and extends along the test electrode pads TP1 and TP2. The first-layer metal wiring M01 is electrically coupled to the island-like metal portion IM1 of the test electrode pad TP0. The island-like metal portion IM1 and the first-layer metal wiring M01 are formed in the same wiring layer. The source impurity region SI is electrically coupled to the first-layer metal wiring M02 via the contact CT. The first-layer metal wiring M02 passes through a region defined between the island-like metal portions IM3 and IM4 of the test electrode pad TP3 and extends between the island-like metal portions IM1 and IM2 of the test electrode pad TP2. The first-layer metal wiring M02 is electrically coupled to the island-like metal portion IM1 of the test electrode pad TP2. The drain impurity region DI is electrically coupled to the first-layer metal wiring M03 through the via. The first-layer metal wiring M03 passes between the first-layer island-like metal portions IM1 and IM2 provided for the test electrode pad TP3 and is electrically coupled to the first-layer island-like metal portion IM3 provided for the adjoining test electrode pad TP4.

The backgate impurity region BI of the test element TE3 is electrically coupled to the first-layer metal wiring M04 via the contact. The first-layer metal wiring M04 passes between the first-layer island-like metal portions IM2 and IM4 provided for the test electrode pad TP3 and extends along the test electrode pads TP4 and TP5. The first-layer metal wiring M04 is electrically coupled to the first-layer island-like metal portion IM4 provided for the test electrode pad TP6.

In the test element TE4, its gate electrode GE is electrically coupled to its corresponding second-layer metal wiring M11 through a via (tungsten plug). The second-layer metal wiring M11 passes through a region defined between the first-layer island-like metal portions IM1 and IM3 (i.e., upper second-layer island-like metal portions) provided for the test electrode pad TP4 and extends from the test electrode pads TP3 to TP2. The second-layer metal wiring M11 is electrically coupled to its corresponding second-layer island-like metal portion provided at the layer above the first-layer island-like metal portion IM1 of the test electrode pad TP1.

The source impurity region SI is electrically coupled to its corresponding second-layer metal wiring M12 through the via (tungsten plug). The second-layer metal wiring M12 passes through a region between the island-like metal portions IM3 and IM5 (i.e. between the second-layer island-like metal portions) provided for the test electrode pad TP4 and is electrically coupled to its corresponding island-like metal portion provided at the layer above the island-like metal portion IM1 provided for the adjoining test electrode pad TP3. The second-layer island-like metal portions each formed of the second-layer metal wiring are not shown even in FIG. 4.

The drain impurity region DI is electrically coupled to its corresponding second-layer metal wiring M13 through the via (tungsten plug). The second-layer metal wiring M13 passes through a region defined between the first-layer island-like metal portions IM1 and IM2 (i.e. between the upper second-layer island-like metal portions) provided for the test electrode pad TP4 and is electrically coupled to its corresponding second-layer island-like metal portion provided at the layer above the island-like metal portion IM3 of the adjoining test electrode pad TP5.

The backgate impurity region BI is electrically coupled to its corresponding second-layer metal wiring M14 through the via (tungsten plug). The second-layer metal wiring M14 passes through a region defined between the island-like metal portions IM2 and IM4 (between the upper second-layer island-like metal portions) provided for the test electrode pad TP4 and is electrically coupled to its corresponding second-layer island-like metal portion (provided corresponding to the first-layer island-like metal portion IM4) of the test electrode pad TP7 shown in FIG. 3 via the test electrode pads TP5 and TP6.

As shown in FIG. 4, each of the first-layer metal wirings M01 through M04 is used as the first metal wiring ML1 shown in FIG. 3. Each of the second-layer metal wirings M11 through M14 is used as the second metal wiring ML1. These first-layer and second-layer metal wirings are of wirings different in wiring layer respectively. Terminals of the respective test elements can be electrically coupled to their corresponding test electrode pads provided directly thereabove and the test electrode pads adjoining with being spaced one test electrode pads apart without wiring collisions.

Metal portions for intermediate wiring layers are formed in an island fashion with respect to the test electrode pads and individually separated from one another to form wiring passage regions. Thus, the test elements close to regions directly below the test electrode pads can be electrically coupled to their corresponding adjoining test electrode pads without colliding with their corresponding metal portions of the test electrode pads located directly thereabove.

Figure 5:
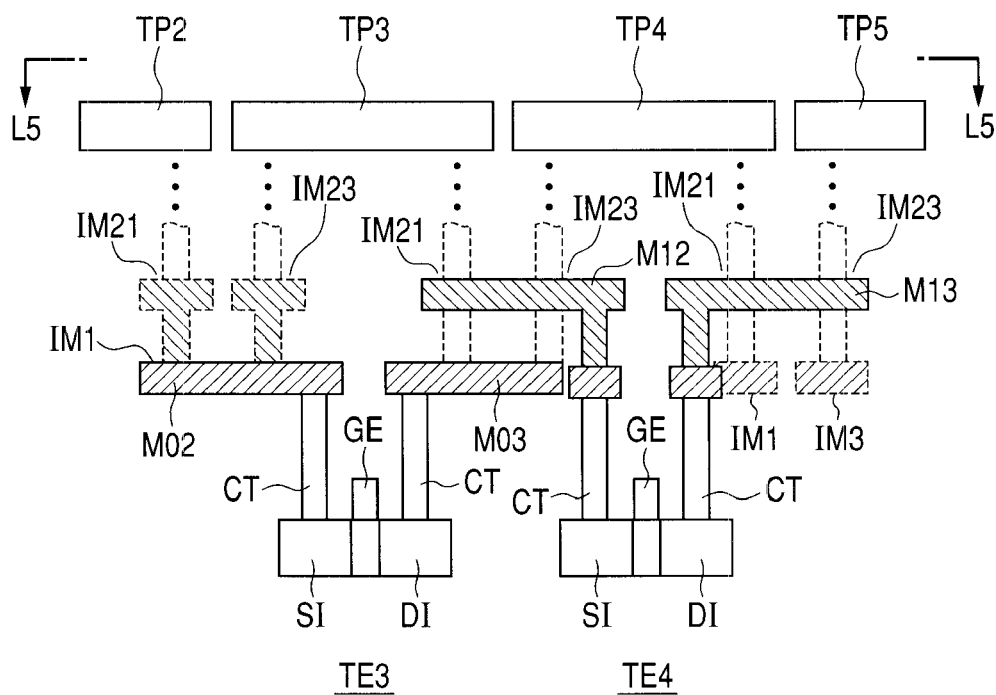
FIG. 5 is a diagram schematically showing a sectional structure taken along line L5-L5 shown in FIG. 4.

FIG. 5 is a diagram showing a sectional structure taken along line L5-L5 shown in FIG. 4. The island-like metal portions comprised of the first-layer metal wirings and the second-layer metal wirings are shown in FIG. 5. Since these island-like metal portions do not appear in the sectional structure taken along line L5-L5, they are indicated by broken lines in FIG. 5.

In the test element TE3, the source impurity region SI and the drain impurity region DI are electrically coupled to their corresponding first-layer metal wirings M02 and M03 via the contacts CT. The first-layer metal wiring M02 is electrically coupled to its corresponding first-layer island-like metal portion IM1 provided for the test electrode pad TP2.

The first-layer island-like metal portion IM1 is electrically coupled to its corresponding second-layer island-like metal portion IM21. A second-layer island-like metal portion IM23 is provided adjacent to the second-layer island-like metal portion IM21 with respect to the test electrode pad TP3. The first-layer metal wiring M03 is electrically coupled to the second-layer island-like metal portion IM23 via the first-layer island-like metal portion IM3 provided for the test electrode pad TP4.

In the test element TE4, the source impurity region SI and the drain impurity region DI are electrically coupled to their corresponding first-layer intermediate wirings via the contacts CT. These intermediate wirings are respectively electrically coupled to the second-layer metal wirings M12 and M13 through the vias (plugs). The second-layer metal wiring M12 is electrically coupled to its corresponding second-layer island-like metal portion IM21 provided for the test electrode pad TP3. The second-layer metal wiring M13 is electrically coupled to its corresponding second-layer island-like metal portion IM23 provided for the test electrode pad TP5. These second-layer island-like metal portions IM21 and IM23 are respectively electrically coupled to the first-layer island-like metal portions IM1 and IM3.

An copper wiring is used as each metal wiring. Wirings and plugs (via filling) are formed by a damascene method. The contacts CT are normally formed by tungsten plugs. Each top-layer test electrode pad is formed of an aluminum wiring. Metal wirings each located in a layer below this test electrode pad and above the gate electrode are all formed using the copper wiring.

Figure 6:
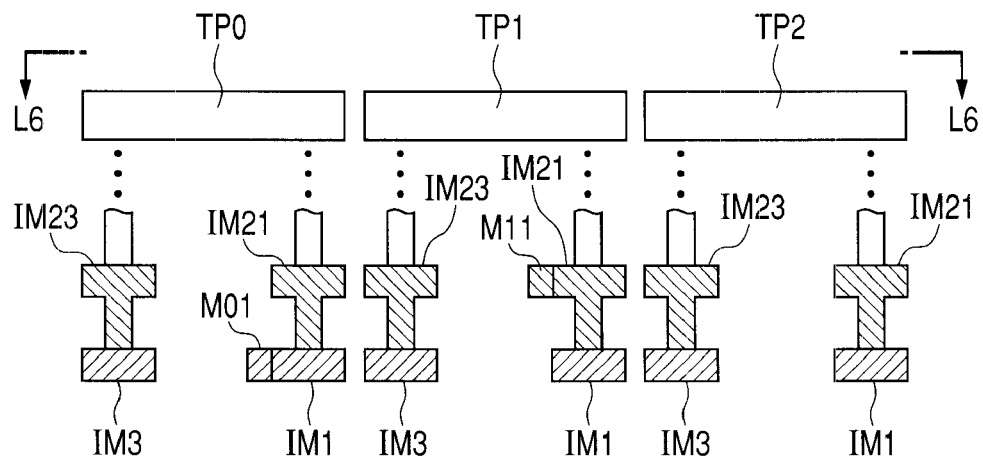
FIG. 6 is a diagram schematically showing a sectional structure taken along line L6-L6 shown in FIG. 4.

FIG. 6 is a diagram schematically showing a sectional structure taken along line L6-L6 shown in FIG. 4. In FIG. 6, the island-like metal portion IM1 provided for the test electrode pad TP0 is electrically coupled to its corresponding first-layer metal wiring M01. The second-layer island-like metal portion IM21 provided for the test electrode pad TP1 is electrically coupled to its corresponding second-layer metal wiring M11. Thus, the gate electrodes of the test elements TE3 and TE4 are electrically coupled to each other using the wirings different in wiring layer.

No wirings are coupled to the island-like metal portions IM3, IM23, IM1 and IM21 provided for the test electrode pad TP3 in the layout shown in FIG. 4.

The island-like metal portions provided for the respective test electrode pads are electrically coupled to their corresponding test electrode pads through the vias (plugs). Thus, the test elements TE3 and TE4 can be electrically coupled to their corresponding adjoining test electrode pads and coupled to the test electrode pads adjoining with being spaced one test electrode pads apart with respect to the adjoining test electrode pads.

Incidentally, the metal wirings (copper wirings) located above the second layer and the vias located therebelow are formed using the damascene method, and the formation of wirings and the filling of the vias are conducted simultaneously.

Figure 7:
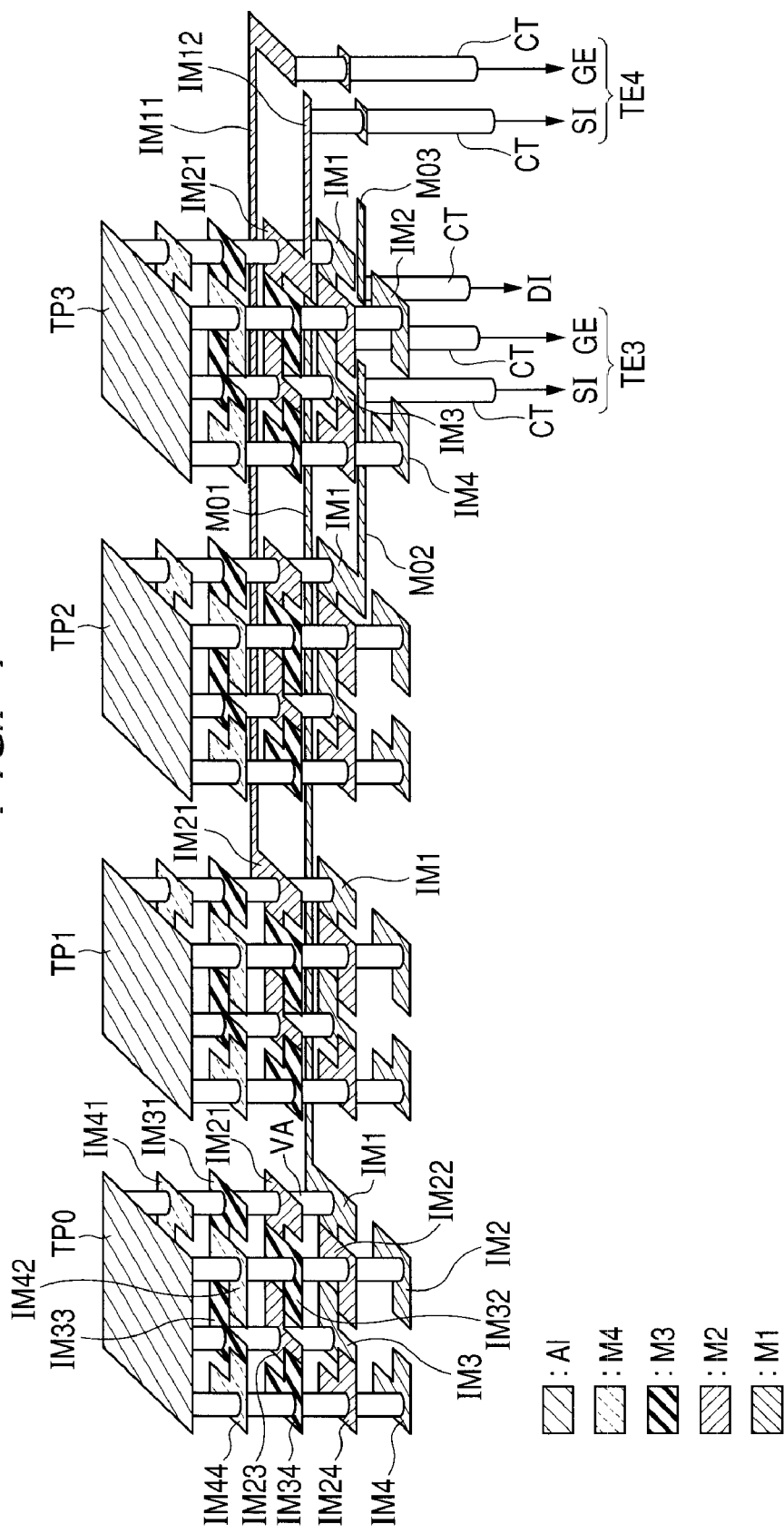
FIG. 7 is a perspective view of the TEG shown in FIG. 4.

FIG. 7 is a perspective view showing a three-dimensional layout of the TEG shown in FIG. 4. Structures of the test electrode pads TP0 through TP3 are illustrated in FIG. 7. In FIG. 7, the same reference numerals are respectively attached to portions corresponding to the components shown in FIG. 4.

The test electrode pads TP0 through TP3 are respectively formed of an aluminum wiring corresponding to a top layer. These test electrode pads TP0 through TP3 are provided with their corresponding island-like metal portions according to the wirings of the metal wiring layers formed over the respective semiconductor chips. FIG. 7 shows, as one example, where a five-layer metal wiring structure having copper wirings of four layers and an aluminum wiring of a top layer is used. In this structure, the island-like metal portions for each test electrode pad are identical in layout. At given test electrode pads TP (TP0 through TP3), first-layer, second-layer, third-layer and fourth-layer island-like metal portions IM1, IM21, IM31 and IM41 arranged in a vertical direction are electrically coupled to one another through a via VA and further electrically coupled to their corresponding test electrode pads TP. Likewise, first-layer, second-layer, third-layer and fourth-layer island-like metal portions IM2, IM22, IM32 and IM42 arranged in the vertical direction are electrically coupled to one another through a via VA and further electrically coupled to their corresponding test electrode pads TP. Island-like metal portions IM3, IM23, IM33 and IM43 arranged in the vertical direction are coupled to one another through a via VA and further electrically coupled to their corresponding test electrode pads TP. Likewise as well, island-like metal portions IM4, IM24, IM34 and IM44 arranged in the vertical direction are electrically coupled to one another through a via VA and further electrically coupled to their corresponding test electrode pads TP.

Electrical couplings of contacts CT to source impurity regions SI and gate electrode GE at the test elements TE3 and TE4 are typically shown. The source impurity region SI of the test element TE3 is electrically coupled to its corresponding first-layer metal wiring M02 via the contact CT. The first-layer metal wiring M02 passes through a region defined between the first-layer island-like metal portions IM3 and IM4 of its corresponding test electrode pad TP3 and is electrically coupled to the first-layer island-like metal portion IM1 of the adjoining test electrode pad TP2. The gate electrode GE of each test element TE is electrically coupled to its corresponding first-layer metal wiring M01 through the contact CT. The first-layer metal wiring M01 passes through a region defined between the first-layer island-like metal portions IM3 and IM1 of its corresponding test electrode pad TP3, passes through the outside of the test electrode pads TP2 and TP1 and is electrically coupled to its corresponding first-layer island-like metal portion IM1 of the test electrode pad TP3.

As to the test element TE4, its source impurity region SI is electrically coupled to the contact CT and its corresponding second-layer metal wiring M12 through an intermediate wiring and a via (plug). The second-layer metal wiring M12 is electrically coupled to its corresponding second-layer island-like metal portion IM21 of the test electrode pad TP3. The gate electrode GE thereof is electrically coupled to its corresponding second-layer metal wiring M11 through the contact CT, intermediate wiring and via. The second-layer metal wiring M11 is disposed so as to extend outside beyond the test electrode pads TP3 and TP2 and is electrically coupled to its corresponding second-layer island-like metal portion IM21 of the test electrode pad TP1.

In the test elements TE3 and TE4 as shown in FIG. 7, the metal wirings are provided so as to pass through the gap region between the island-like metal portions of the their corresponding test electrode pads. The metal wirings are electrically coupled to their corresponding adjoining test electrode pads or their corresponding same-layer island-like metal portions of the test electrode pads adjoining with being spaced one test electrode pads apart and electrically coupled to their corresponding test electrode pads that adjoin corresponding thereto.

With the layout of the metal portions in island form (in L-shaped fashion) with respect to the test electrode pads each corresponding to the top layer, the terminals of the respective test elements can be electrically coupled to their corresponding test electrode pads adjoining while wiring collisions are being avoided, even if the test elements are disposed in alignment at the test electrode pads. Using the wirings different in wiring layer with respect to the adjoining test elements, the collisions of the wirings are prevented and the wirings for the electrodes/terminals can be laid out.

Incidentally, in FIG. 7, the metal wirings of the four layers are used for the wirings between the test elements and the test electrode pads, and the respective wirings are electrically coupled to their corresponding island-like metal portions of the same layer. In the island-like metal portions disposed for the test electrode pads, however, the number of layers thereof is determined depending on the number of wiring layers employed in the semiconductor devices that adjoin on the semiconductor chips.

FIGS. 8 through 11 are diagrams showing a process for manufacturing the TEG according to the first preferred embodiment of the present invention. The method for manufacturing the TEG according to the first embodiment of the present invention will be explained below with reference to FIGS. 8 through 11.

Figure 8:
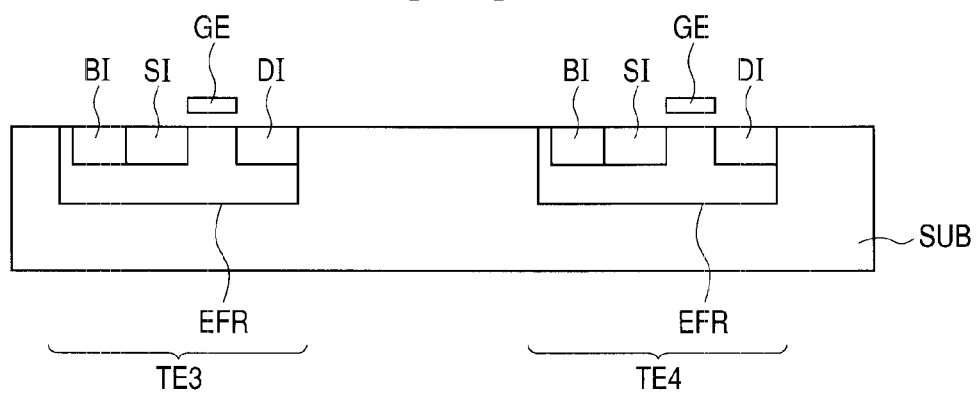
FIG. 8 is a diagram illustrating a manufacturing process of the TEG according to the first preferred embodiment of the present invention.

As shown in FIG. 8, element forming regions EFR are first formed over a semiconductor substrate SUB of a shunt area (scribe area) formed with shut lines (scribe lines) in association with test electrode pad layout regions or areas. When test elements TE3 and TE4 are of MOS transistors as described above, the element forming regions EFR are used as backgate regions. A source impurity region SI, a drain impurity region DI and a backgate impurity region BI are formed in the surface of each element forming region EFR as active regions. The backgate impurity region BI and the element forming region EFR are the same conductivity type and a backgate bias is applied to the element forming region EFR via the backgate impurity region BI. Each of the source impurity region SI and the drain impurity region DI is a conductivity type different from the element forming region EFR.

Next, a gate electrode GE is formed between the source impurity region SI and the drain impurity region DI through an unillustrated gate insulating film interposed therebetween.

Figure 9:
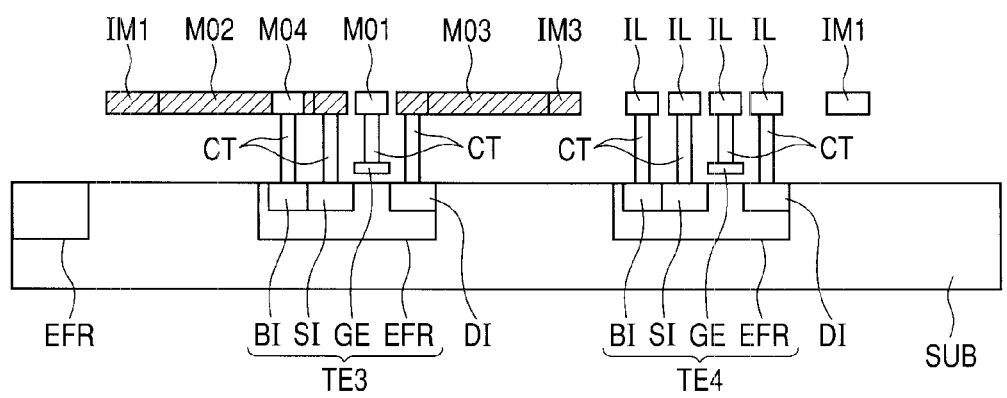
FIG. 9 is a diagram showing a manufacturing process of the TEG according to the first preferred embodiment of the present invention.

Next, as shown in FIG. 9, electrode wirings are formed for the test elements TE3 and TE4. Contacts CT comprised of, for example, tungsten plugs are formed with respect to the drain impurity regions DI, the source impurity regions SI and the backgate impurity regions BI respectively. Contacts CT are also formed even for the gate electrodes GE. Thereafter, first-layer metal wirings are formed in predetermined patterns. In the test element TE3, the contact CT coupled to the source impurity region SI is electrically coupled to its corresponding first-layer island-like metal portion IM1 formed in an adjoining test electrode pad through the first-layer metal wirings M0. Likewise, the contact CT provided for the drain impurity region DI is also electrically coupled to its corresponding first-layer island-like metal portion IM3 provided with respect to an adjoining test electrode pad through the first-layer metal wiring M03. Further, the contacts CT are respectively electrically coupled to the first-layer metal wirings M01 and M04 even with respect to the gate electrode GE and the backgate impurity region BI.

In the test element TE4, intermediate wirings IL formed of first-layer metal wirings are formed with respect to the contacts CT. Upon the formation of the first-layer metal wirings, the couplings to island-like metal portions provided for other test electrode pads are not performed on the test element TE4.

Figure 10:
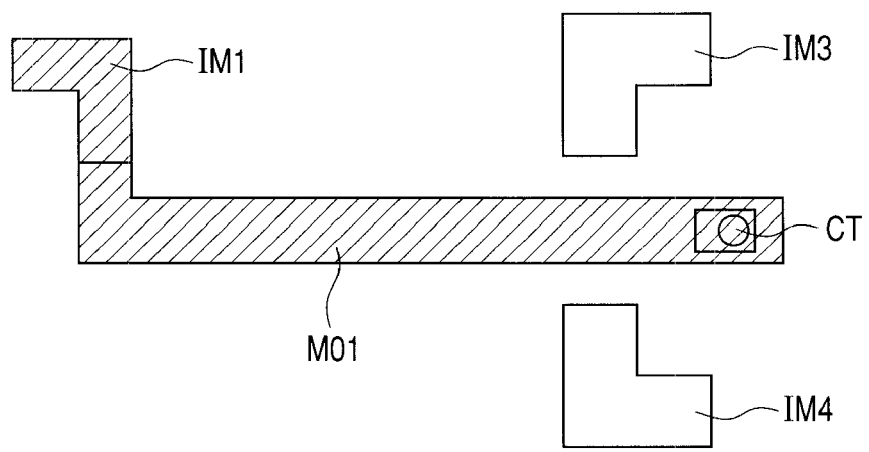
FIG. 10 is a diagram depicting one example of a layout of each wiring in a manufacturing process of the TEG according to the first preferred embodiment of the present invention.

Wiring of the first-layer metal wirings for the test element TE3 shown in FIG. 9 is conducted as described below. That is, as shown in FIG. 10, a first-layer metal wiring M01 is provided so as to pass between first-layer island-like metal portions IM3 and IM4 provided in its corresponding test electrode pad and is electrically coupled to its first-layer island-like metal portion IM1 for an adjoining test electrode pad. Thus, even though the test element is provided corresponding to the test electrode pad, the electrode wirings for the test element can electrically be coupled to island-like metal portions of the adjoining test electrode pad without colliding with island-like metal portions of its corresponding test electrode pad. Other drain electrode wirings, backgate electrode drawing wirings and gate electrode wirings are also disposed so as to pass through regions between their corresponding adjoining island-like metal portions.

Figure 11:
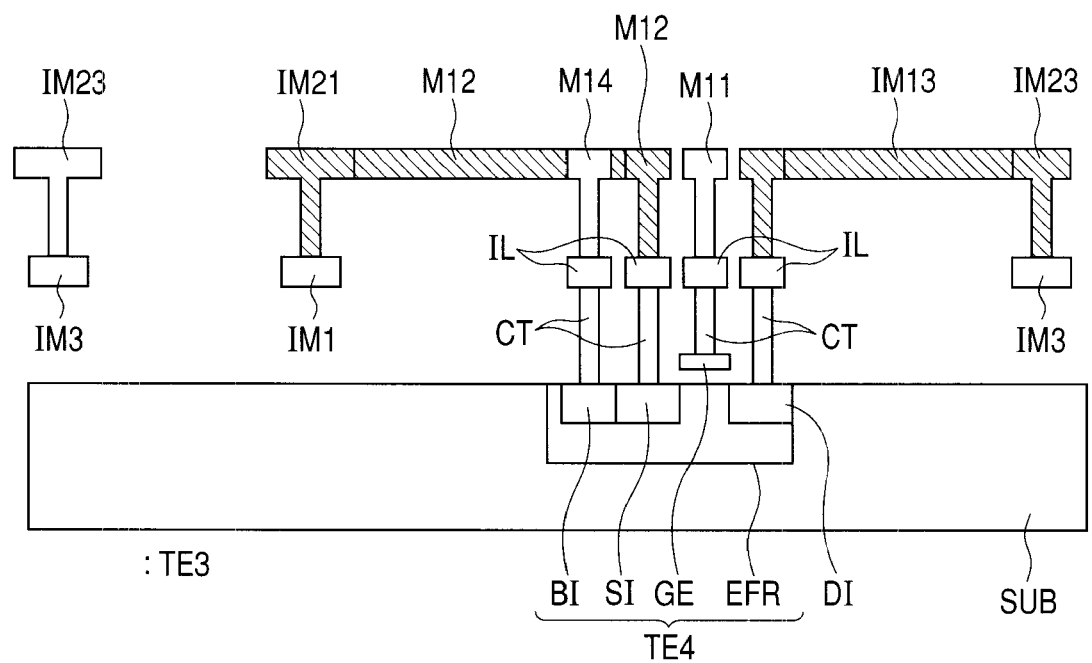
FIG. 11 is a diagram showing a manufacturing process of the TEG according to the first preferred embodiment of the present invention.

Next, as shown in FIG. 11, second-layer metal wirings are formed in predetermined patterns. In the test element TE4 in this process step, the second-layer metal wirings are electrically coupled to their corresponding intermediate wirings IL provided for the lower contacts CT. That is, the source impurity region SI is electrically coupled to its corresponding island-like metal portions IM1 and IM21 provided for each adjoining test electrode pad through the corresponding contact CT, intermediate wiring IL and second-layer metal wiring M12. The drain impurity region DI is electrically coupled to its corresponding second-layer island-like metal portion IM23 provided in the adjoining test electrode pad by the corresponding second-layer metal wiring M13 and further electrically coupled to its corresponding lower first-layer island-like metal portion IM3. The second-layer metal wirings M11 and M14 are respectively formed even with respect to the gate electrode GE and the backgate impurity region BI and electrically coupled to their corresponding second-layer island-like metal portions provided in the corresponding test electrode pad.

Even upon formation of electrical coupling using the second-layer metal wirings, as shown in FIG. 11, the second-layer metal wirings are provided so as to pass between the second-layer island-like metal portions provided for the corresponding test electrode pad, and the test element can electrically be coupled to each adjoining test electrode pad in avoidance of wiring collisions.

Thereafter, island-like metal portions are formed by metal wirings (copper wirings) for respective upper layers in the same process as for wiring of elements for a semiconductor device lying over each semiconductor chip. In the final process step of the metal wirings, test electrode pads (TP) are formed as top-layer metal wirings using aluminum wirings, whereby the TEG shown in FIG. 4 through 7 is formed.

The manufacture of the test elements, island-like metal portions and test electrode pads shown in FIGS. 8 through 11 is performed in the same process as for the formation and wiring of the elements of the semiconductor device formed in each semiconductor chip.

Figure 12:
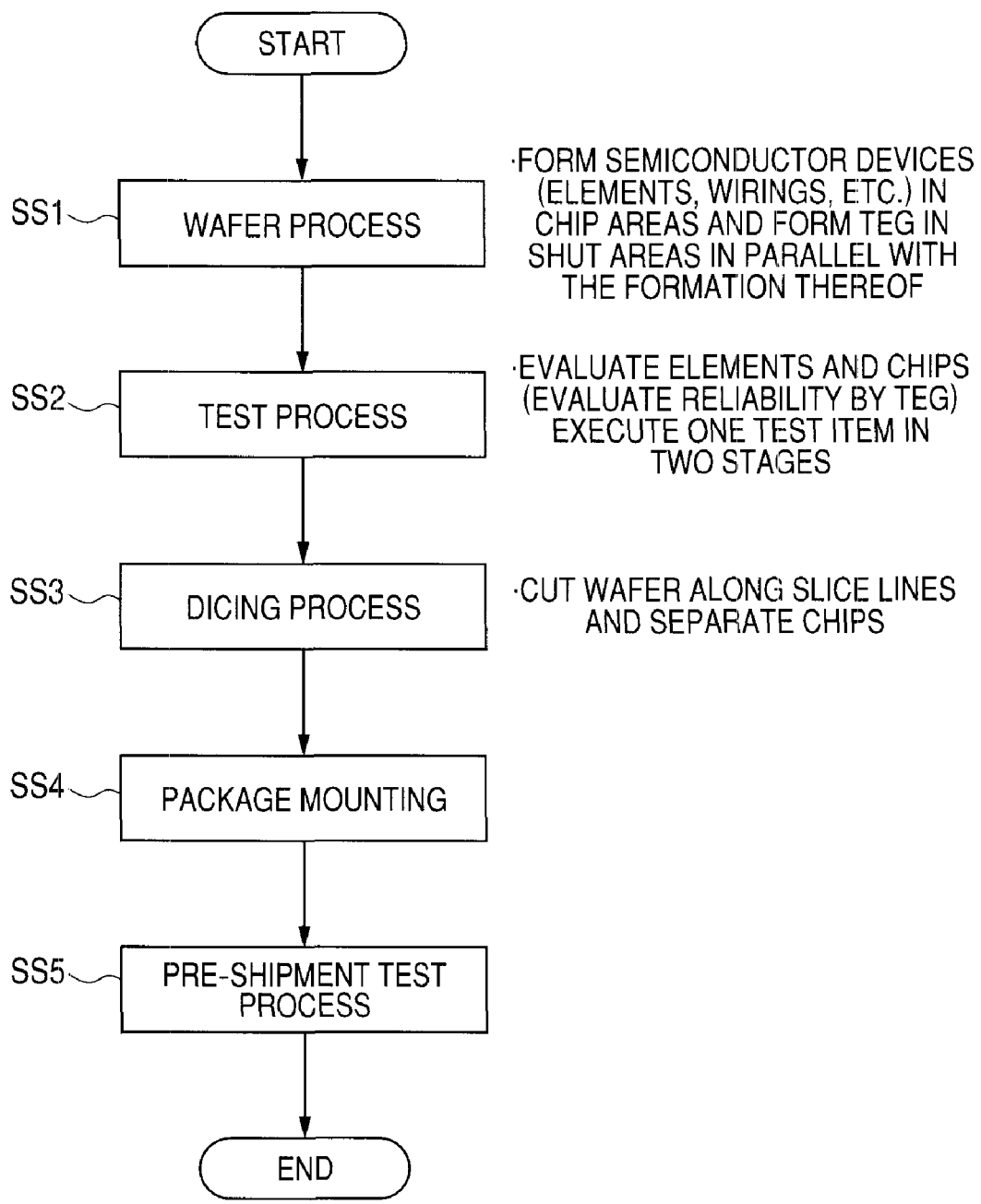
FIG. 12 is a flowchart illustrating a process for manufacturing a semiconductor chip of a counter device according to the first preferred embodiment of the present invention.

FIG. 12 is a diagram showing a process for manufacturing a semiconductor device according to a first preferred embodiment of the present invention. The process for manufacturing the semiconductor device according to the first preferred embodiment will be explained below in brief with reference to FIG. 12.

A wafer process is executed (Step SS1). Semiconductor devices set as desired targets are formed in respective chip areas lying over a semiconductor wafer. TEGs are formed in areas for slice lines in parallel with the formation of elements and wirings for each semiconductor device.

When the wafer process is completed, a test at a wafer level is executed (Step SS2). In this test process, the evaluation of elements and semiconductor chips is executed. Reliability evaluations corresponding to various management or control items such as threshold voltages and transconductance of MOS transistors and the like are executed using each TEG. In the test process using each TEG, one test item is executed in two stages as shown in FIG. 13. The test process using the TEGs will be explained with reference to FIG. 13.

Consider a state in which test electrode pads TP0 through TP (2n+1) are arranged as a TEG as shown in FIG. 13(a). At this test process, probe pins PP0 through PPn are brought into contact with the even-numbered test electrode pads TP0, TP2, ... TP (2n). The pitch between the test probe pins PP0 through PPn is 2·LT whereas the pitch between the test electrode pads TP0 through TP (2n+1) is LT. As one example, the pitch between the adjacent pads is taken as 60 μm and the pitch between the adjacent probe pins is taken as 120 μm. A test is executed while the probe pins PP0 through PPn are being brought into contact with their corresponding even-numbered test electrode pads TP0 through TP (2n) as a TEG1. In this case, the test is conducted on test elements TEo placed below the odd-numbered test electrode pads TP3 through TP (2n−1). It is thus possible to make measurements on the respective test elements without the influence of the contact of the probe pins with the elements targeted for the test. When each test element is of a MOS transistor, for example, a threshold voltage Vth or transconductance gm or the like is taken as a test item.

Next, when the test based on the contact of the probe pins PP0 through PPn with the even-numbered test electrode pads TP0 through TP (2n) is completed, the probe pins are moved by 1·LT. Consequently, the probe pins PP0 through PPn are shifted by one electrode pad pitch, i.e., ½ of the probe pin pitch. Therefore, the probe pins PP0 through PPn are respectively brought into contact with the odd-numbered test electrode pads TP1 through TP (2n+1). In this state, the measurement of TEG is carried out. In this case, tests on the test elements TEe placed below the even-numbered test pads TP4, ... TP (2n−2) as the test elements TE are conducted.

Thus, the test element groups TEG1 and TEG2 are sequentially tested for test management items at this semiconductor chip, whereby the test on the entire TEG provided corresponding to the semiconductor chip is completed. Since a large number of TEG elements are provided, it is possible to evaluate many management items, make a decision as to a failure/non-failure of each semiconductor device accurately and obtain the semiconductor device high in reliability.

Upon the test at the wave level, a circuit characteristic of the semiconductor device formed in each semiconductor chip, a failure of its circuit operation, etc. are also evaluated using the pads lying on the semiconductor chip.

Referring back to FIG. 12, when the test process at the wafer level in Step SS2 is completed, dicing is performed in accordance with the slice lines on the semiconductor wafer to separate it into individual semiconductor chips (chip dies) (Step SS3).

Each non-defective semiconductor chip identified by the test process at the wafer level, of the individual semiconductor chips is mounted in a package (Step SS4). After the package mounting, a final pre-shipment test (for example, burn-in or the like) is conducted (Step SS5) and each final non-defective product or unit is shipmented.

According to the first preferred embodiment of the present invention as described above, the test elements are respectively placed in the areas lying directly below the test electrode pads. These test elements are electrically coupled to their corresponding test electrode pads adjacent to the test electrode pads provided directly thereabove and the test electrode pads adjoining with being spaced one electrode pads apart. Thus, the pitch between the adjacent probe pins is twice that between the adjacent test electrode pads, and a number of test patterns can be measured using the conventional probe cards.

The test elements are laid out below the test electrode pads. Thus, the number of the test elements can be increased without an increase in the area as compared with such a configuration that the test elements are respectively placed in the areas between the test electrode pads. The test elements corresponding to many test management items can be laid out and tested. Further, since the probe pins are not brought into contact with the test electrode pads lying directly above the test elements targeted for measurement upon testing, the test elements targeted for testing can be measured accurately without adverse effects such as stress being applied to the test elements.

Second Preferred Embodiment

Figure 14:
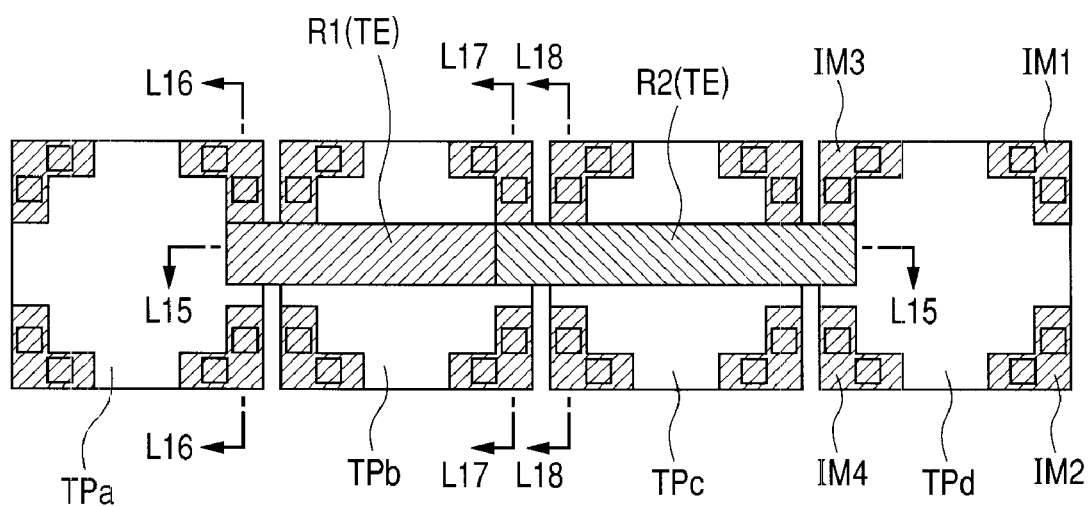
FIG. 14 is a diagram schematically illustrating a plan layout of a TEG according to a second preferred embodiment of the present invention.

FIG. 14 is a diagram schematically showing a plan layout of a TEG according to a second preferred embodiment of the present invention. In FIG. 14, test electrode pads TPa through TPd are disposed in alignment in one row. Resistive elements R1 and R2 are formed in their corresponding areas lying directly below the test electrode pads TPb and TPc as test elements TE. The resistive element R1 is comprised of a first-layer metal wiring and the resistive element R2 is comprised of a second-layer metal wiring. The resistive element R1 is electrically coupled to the test electrode pads TPa and TPc adjacent thereto, and the resistive element R2 is electrically coupled to the test electrode pads TPb and TPd adjacent thereto. In a manner similar to the first preferred embodiment even in the configuration of the TEG shown in FIG. 14, island-like metal portions are provided corresponding to the test electrode pads for electrical couplings between the test electrode pads and the test elements. First-layer island-like metal portions IM1 through IM4 are typically illustrated in FIG. 14.

Figure 15:
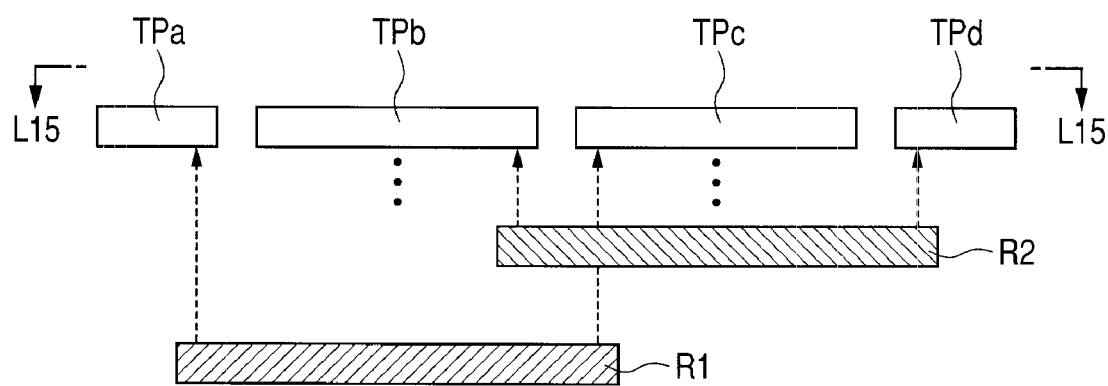
FIG. 15 is a diagram schematically showing a sectional structure taken along line L15-L15 shown in FIG. 14.

FIG. 15 is a diagram schematically showing a sectional structure taken along line L15-L15 shown in FIG. 14. In FIG. 15, the resistive element R1 formed of the first-layer metal wiring is placed in the area lying directly below the test electrode pad TPb. The resistive element R1 extends to its corresponding portions lying below the test electrode pads TPa and TPc and is electrically coupled to these test electrode pads TPa and TPc as indicated by broken lines.

The resistive element R2 is comprised of a second-layer metal wiring placed in a layer above the resistive element R1 and is formed in the area lying directly below the test electrode pad TPc. The resistive element R2 is electrically coupled to the adjoining test electrode pads TPb and TPd (their electrical couplings are indicated by arrows).

Figure 16:
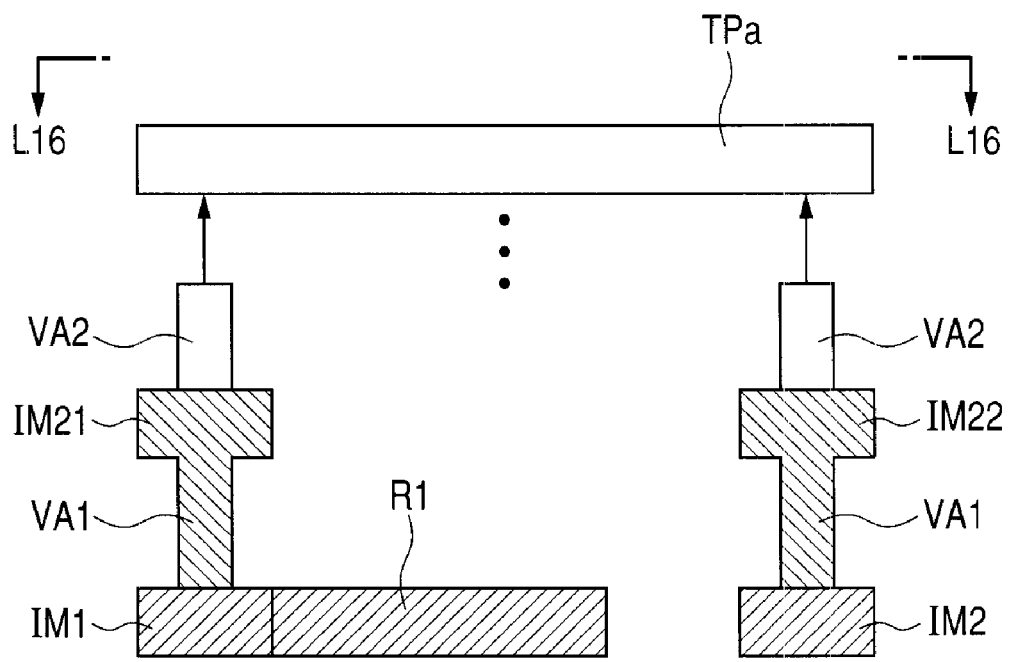
FIG. 16 is a diagram schematically depicting a sectional structure taken along line L16-L16 shown in FIG. 14.

FIG. 16 is a diagram schematically showing a sectional structure taken along line L16-L16 shown in FIG. 14. The resistive element R1 is electrically coupled to the first-layer island-like metal portion IM1 at the portion below the test electrode pad TPa. The first-layer island-like metal portion IM1 is electrically coupled to the test electrode pad TPa through a via VA1 and a second-layer island-like metal portion IM21, and an upper layer wiring such as a via VA2 and a via. The resistive element R1 is not coupled to the first-layer island-like metal portion IM2. In a manner similar to the first-layer island-like metal portion IM1 even with respect to the first-layer island-like metal portion IM2, a via VA1, a second-layer island-like metal portion IM22 and a via VA2 are formed and electrically coupled to the test electrode pad TPa.

Figure 17:
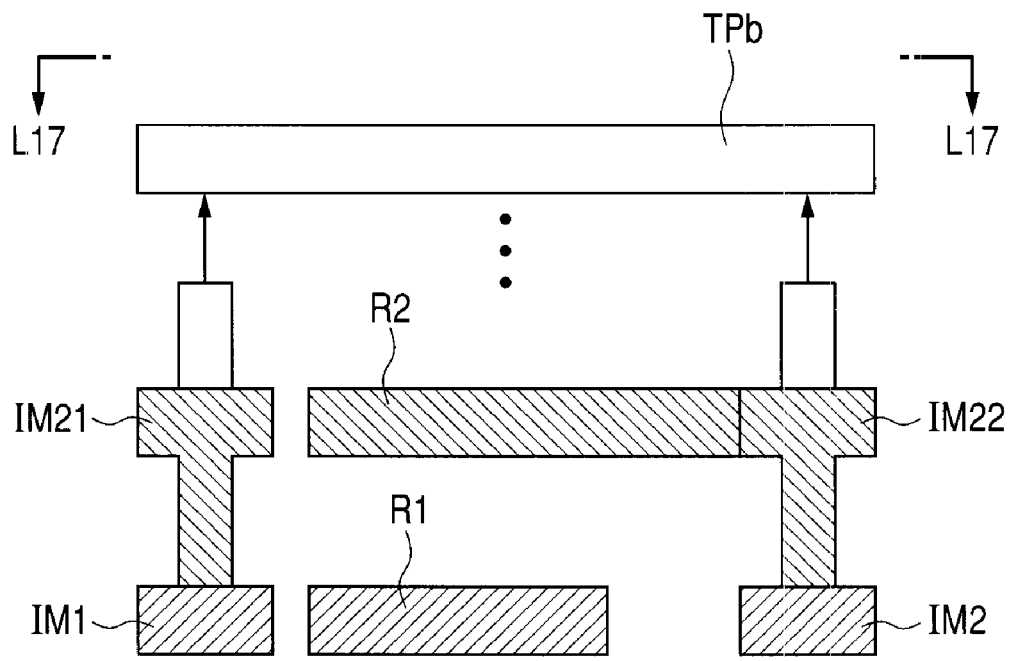
FIG. 17 is a diagram schematically showing a sectional structure taken along line L17-L17 shown in FIG. 14.

FIG. 17 is a diagram schematically showing a sectional structure taken along line L17-L17 shown in FIG. 14. In FIG. 17, the resistive elements R1 and R2 are formed by their corresponding first-layer metal wiring and second-layer metal wiring at the portion below the test electrode pad TPb. The resistive element R1 passes through an area between the first-layer island-like metal portions IM1 and IM2. On the other hand, the resistive element R2 formed of the second-layer metal wiring is electrically coupled to its corresponding second-layer island metal portion IM22. The second-layer island-like metal portions IM22 and IM21 are respectively electrically coupled to the test electrode pad TPb through vias and island-like metal portions formed in an upper layer.

Figure 18:
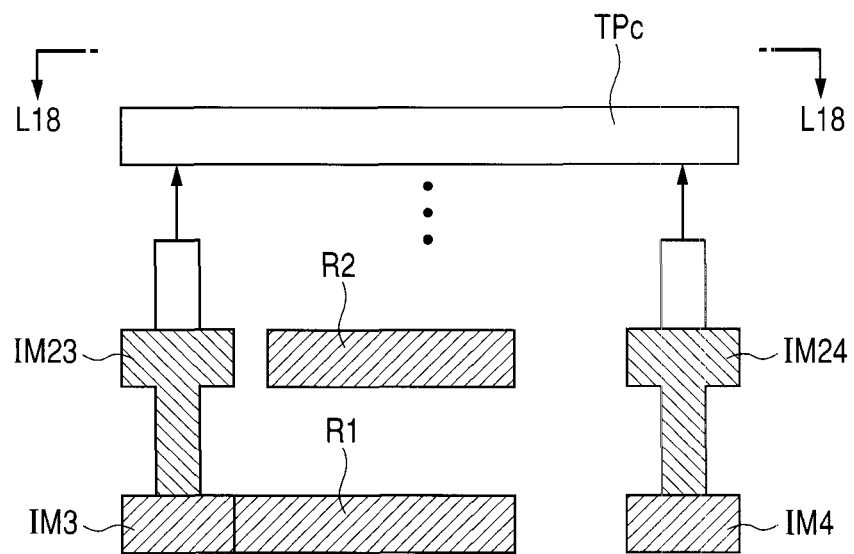
FIG. 18 is a diagram schematically illustrating a sectional structure taken along line L18-L18 shown in FIG. 14.

FIG. 18 is a diagram schematically showing a sectional structure taken along line L18-L18 shown in FIG. 14. In FIG. 18, the resistive elements R1 and R2 are placed at the portion below the test electrode pad TPc. The resistive element R2 formed of the second-layer metal wiring passes through an area between second-layer island-like metal portions IM23 and IM24. On the other hand, the resistive element R1 is electrically coupled to the first-layer island-like metal portion IM3. The second-layer island-like metal portion IM24 is electrically coupled to its corresponding first-layer island-like metal portion IM4 through a via. Likewise, these second-layer island-like metal portions IM23 and IM24 are also electrically coupled to their corresponding test electrode pad TPc through upper-layer vias and island-like metal portions.

Thus, the wiring-coupling intermediate layers for the respective test electrode pads are formed in island form even when the resistive elements are configured using the metal wirings simply, thereby making it possible to dispose the wirings that are caused to pass through each area therebetween and form the resistive elements.

The resistive elements provided at the adjacent electrode pads are formed by the wirings of the wiring layers different from each other, thereby making it possible to electrically couple the resistive elements formed at the portions directly below the respective test electrode pads to their corresponding adjoining test electrode pads with no wiring collision.

Incidentally, when a resistive element R3 and the like are further coupled, the resistive elements simply extend to their corresponding three test electrode pads. The first-layer and second-layer metal wirings are alternately placed, thereby making it possible to dispose the resistive elements in association with the test electrode pads continuously with no collision of the wirings.

In the structure shown in FIGS. 16 through 18, the resistive elements R1 and R2 are electrically coupled to one of the adjacent test electrode pads. In the resistive element R1 in FIG. 16, however, its end may be formed wide (in T-shaped fashion) to short-circuit the first-layer island-like metal portions IM1 and IM2. In FIG. 17, the resistive element R2 may be formed to short-circuit the second-layer island-like metal portions IM21 and IM22. In FIG. 18, the resistive element R1 may be formed to short-circuit the first-layer island-like metal portions IM3 and IM4.

In each resistive element provided for the test electrode pad, the characteristic value of its seed resistance or the like is measured and process evaluations (evaluations of film thickness/line width and electrical characteristics of each individual element) are performed. A copper wiring is used as the metal wiring in a manner similar to the first preferred embodiment, and an aluminum wiring corresponding to a top layer is used for each test electrode pad. Thus, the metal portions lying in the layer above the second-layer island-like metal portions are formed by the damascene method even in the second preferred embodiment.

According to the second preferred embodiment of the present invention as described above, the resistive elements are disposed as the test elements and placed at the portions directly below the test electrode pads respectively. They are coupled to their corresponding adjoining test electrode pads by the wirings different in wiring layer. Thus, the resistive elements can be placed in a high density corresponding to the respective test electrode pads at the TEG, and an advantageous effect similar to the first preferred embodiment can be obtained.

Incidentally, the process of manufacturing the resistive elements R1 and R2 is similar to the previous first preferred embodiment. They are respectively formed upon the formation of the first-layer and second-layer wirings in parallel with the process of manufacturing the semiconductor device formed over each semiconductor chip.

A test method is similar to the first preferred embodiment. This test method is performed while a TEG configured by even-numbered test electrode pads and a TEG configured by odd-numbered test electrode pads are respectively set with the probe pins being shifted by a pitch between the adjacent electrode pads, i.e., ½ times the pitch between the adjacent probe pins.

Modification

Figure 19:
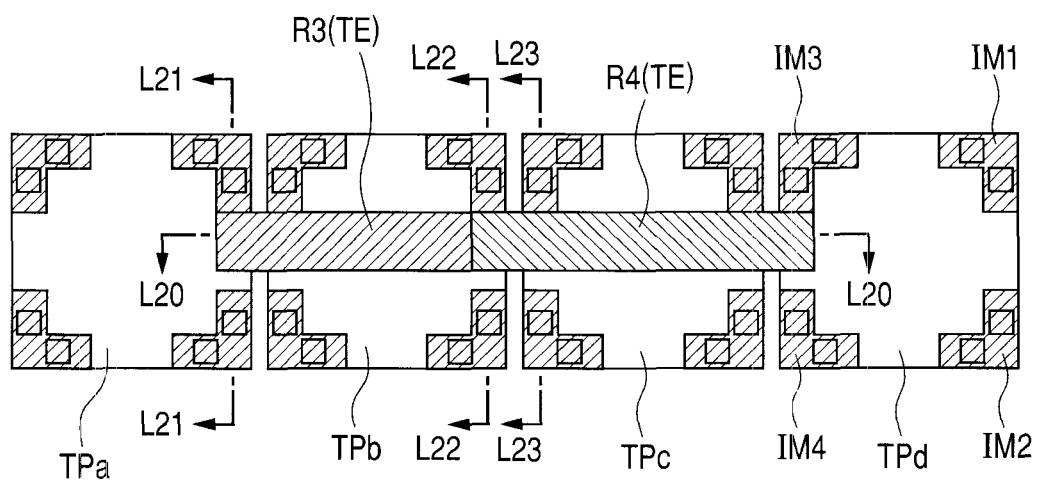
FIG. 19 is a diagram schematically depicting a plan layout of a TEG according to a modification of the second preferred embodiment of the present invention.

FIG. 19 is a diagram schematically showing a plan layout of a modification of the TEG according to the second preferred embodiment of the present invention. The plan layout shown in FIG. 19 is different in placement from the plan layout shown in FIG. 14. Namely, resistive elements R3 and R4 are formed in areas lying directly below test electrode pads TPb and TPc as test elements TE. The resistive element R3 is configured by a polysilicon wiring and the resistive element R4 is configured by a first-layer metal wiring. The resistive element R3 is electrically coupled to its corresponding adjacent test electrode pads TPa and TPc, and the resistive element R4 is electrically coupled to its corresponding adjacent test electrode pads TPb and TPd. In the configuration of the TEG shown in FIG. 19, other configuration is identical to the configuration of the plan layout shown in FIG. 14. The same reference numerals are respectively attached to their corresponding portions and their detailed explanations are omitted. Even in the plan layout shown in FIG. 19 in a manner similar to the plan layout shown in FIG. 14, island-like metal portions are provided corresponding to the test electrode pads for the purpose of electrical couplings between the test electrode pads and the test elements. First-layer island-like metal portions IM1 through IM4 are typically shown even in FIG. 19 in a manner similar to FIG. 14.

Figure 20:
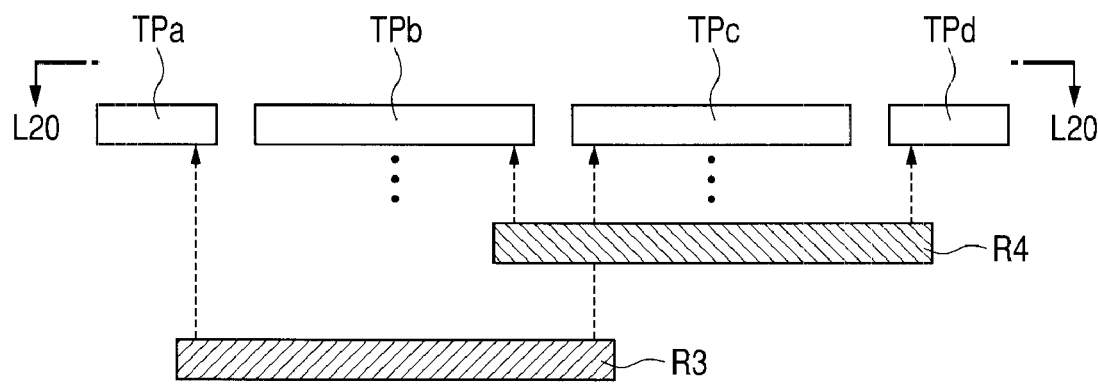
FIG. 20 is a diagram schematically showing a sectional structure taken along line L20-L20 shown in FIG. 19.

FIG. 20 is a diagram schematically showing a sectional structure taken along line L20-L20 shown in FIG. 19. The sectional structure shown in FIG. 20 is identical to the sectional structure shown in FIG. 15 except that the resistive elements R3 and R4 are respectively configured by the polysilicon wiring and the first-layer metal wiring. The same reference numerals are respectively attached to portions corresponding to the structure shown in FIG. 15, and their detailed explanations are omitted.

Even in the layout shown in FIG. 20, the resistive element R3 extends up to portions below the test electrode pads TPa and TPc and is electrically coupled to these test electrode pads TPa and TPc as indicated by arrows of broken lines.

The resistive element R4 is configured by the first-layer metal wiring lying in the layer above the resistive element R3 and formed in the area directly below the test electrode pad TPc. The resistive element R4 is electrically coupled to the adjacent test electrode pads TPb and TPd (electrical couplings therebetween are shown by arrows). Thus, the island-like metal portions disposed below the test electrodes are provided even when the resistive elements are formed as the TEG using the wirings different in wiring layer, thereby making it possible to dispose the resistive elements without changing the layouts of the test electrodes.

Figure 21:
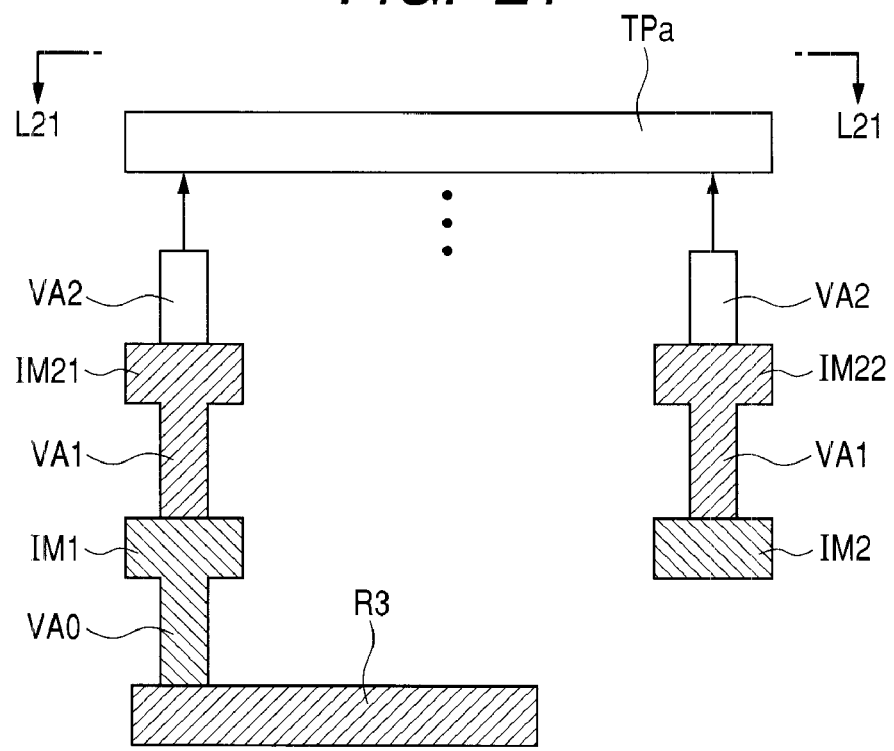
FIG. 21 is a diagram schematically illustrating a sectional structure taken along line L21-L21 shown in FIG. 19.

FIG. 21 is a diagram schematically showing a sectional structure taken along line L21-L21 shown in FIG. 19. The sectional structure shown in FIG. 21 is different from the sectional structure shown in FIG. 15 in terms of the following points. Namely, the resistive element R3 extends up to below the first-layer island-like metal portion IM1 at the portion below the test electrode pad TPa and is electrically coupled to the first-layer island-like metal portion IM1 through a via (tungsten plug) V0. The sectional structure shown in FIG. 21 is identical in other layout to that shown in FIG. 16. The same reference numerals are respectively attached to their corresponding portions and their detailed explanations are omitted.

Figure 22:
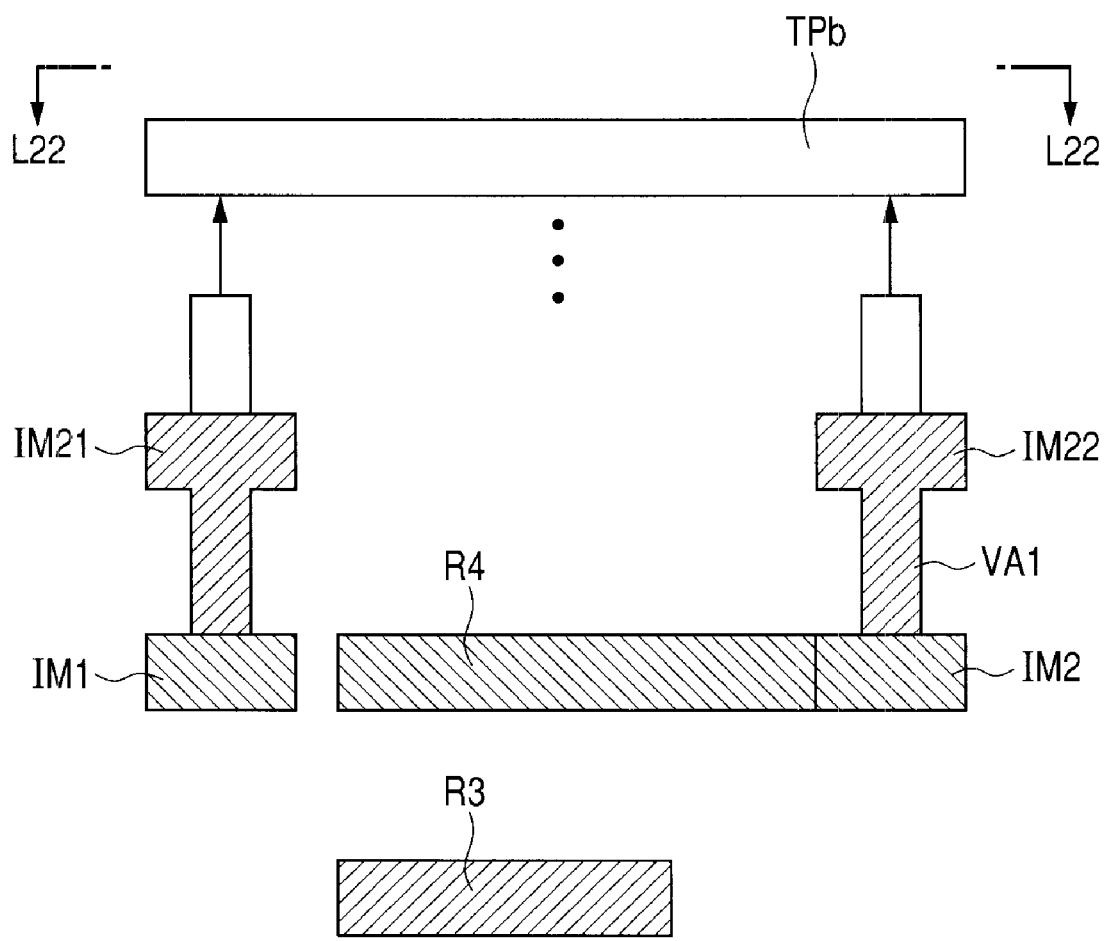
FIG. 22 is a diagram schematically showing a sectional structure taken along line L22-L22 shown in FIG. 19.

FIG. 22 is a diagram schematically showing a sectional structure taken along line L22-L22 shown in FIG. 19. The sectional structure shown in FIG. 22 is different in layout from the sectional structure shown in FIG. 17 in terms of the following points. Namely, at the portion below the test electrode pad TPb, the resistive element R3 configured by the polysilicon wiring passes through a lower portion in an area between the first-layer island-like metal portions IM1 and IM2 provided for the test electrode pad TPb. On the other hand, the resistive element R4 configured by the first-layer metal wiring is electrically coupled to the first-layer island-like metal portion IM2. The first-layer island-like metal portion IM2 is electrically coupled to its corresponding second-layer island-like metal portion through a via (plug) VA1. The first-layer island-like metal portions IM22 and IM21 are respectively electrically coupled to the test electrode pad TPb through vias and island-like metal portions formed in an upper layer. The sectional structure shown in FIG. 22 is identical in other layout to that shown in FIG. 17. The same reference numerals are respectively attached to their corresponding portions and their detailed explanations are omitted.

Figure 23:
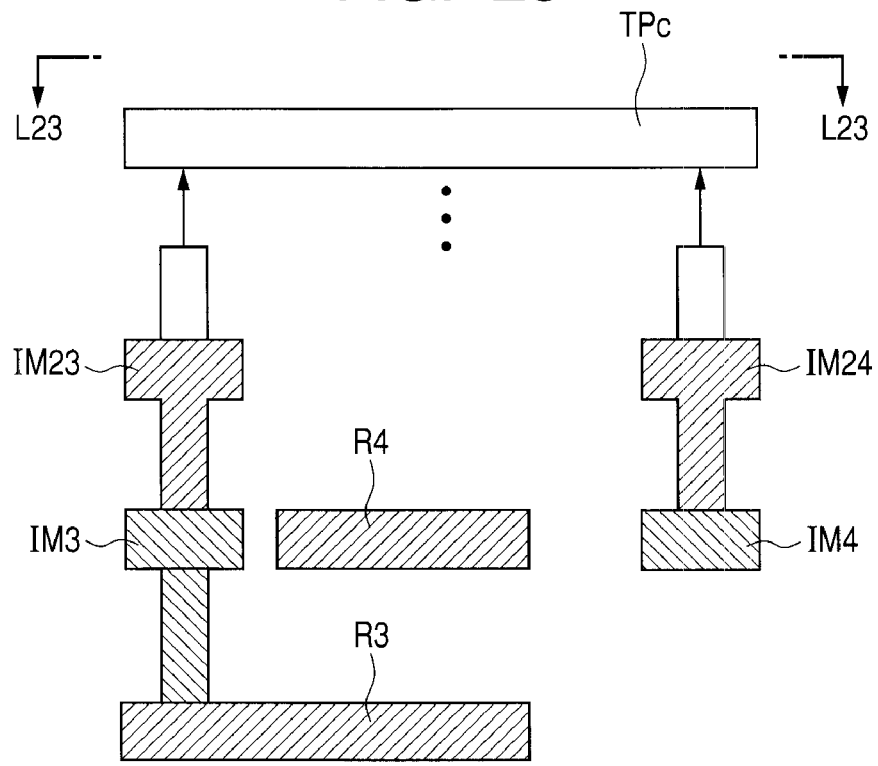
FIG. 23 is a diagram schematically depicting a sectional structure taken along line L23-L23 shown in FIG. 19.

FIG. 23 is a diagram schematically showing a sectional structure taken along line L23-L23 shown in FIG. 19. The sectional structure shown in FIG. 23 is different from the sectional structure shown in FIG. 18 in terms of the following points. Even in FIG. 23, the resistive elements R3 and R4 are disposed below the test electrode pad TPc. The resistive element R4 configured by the first-layer metal wiring passes through the area between the first-layer island-like metal portions IM3 and IM4. On the other hand, the resistive element R3 configured by the polysilicon wiring is electrically coupled to the first-layer island-like metal portion IM3 through a via (tungsten plug) VA0.

In a manner similar to the structure shown in FIG. 18, the first-layer island-like metal portion IM4 is electrically coupled to its corresponding second-layer island-like metal portion IM24 through the via. These second-layer island-like metal portions IM23 and IM24 are also electrically coupled to their corresponding test electrode pad TPc through vias and island-like metal portions in an upper layer in like manner.

Thus, the wiring-coupling intermediate layers for the respective test electrode pads are formed in island form even when the resistive elements are configured using the polysilicon wiring and the first-layer metal wiring, thereby making it possible to dispose the wirings that are caused to pass through the area therebetween and form the resistive elements. Thus, even in the configuration of the modification, an advantageous effect similar to the configuration shown in FIGS. 14 through 18 can be obtained. A test method can also be conducted in a manner similar to the first preferred embodiment.

According to the second preferred embodiment of the present invention as described above, the resistive elements are disposed as the test elements and placed directly below the test electrode pads respectively. They are coupled to their corresponding adjoining test electrode pads by the wirings different in wiring layer. Thus, the resistive elements can be placed in a high density corresponding to the respective test electrode pads at the TEG, and an advantageous effect similar to the first preferred embodiment can be obtained.

Incidentally, the combination of the first and second preferred embodiments may be used, and the transistor elements and the resistive elements may be disposed below the different test electrode pads respectively. That is, the test elements TEo and TEe shown in FIG. 13 may be of the transistor and resistive elements respectively. The polysilicon wiring may be formed in the same process as when the gate electrode of each MOS transistor is formed.

Further, the MOS transistors and the resistive element are used as the test elements. However, bipolar transistors and/or capacitive elements may be respectively used as the test elements for the purpose of the evaluation of a process, circuit characteristics or reliability.

Third Preferred Embodiment

Figure 24:
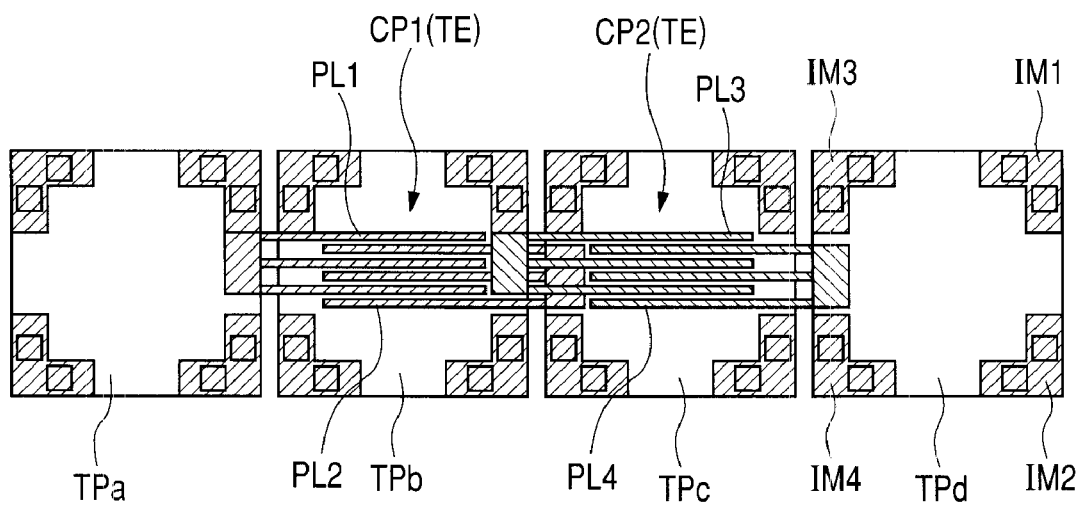
FIG. 24 is a diagram schematically showing a plan layout of a TEG according to a third preferred embodiment of the present invention.

FIG. 24 is a diagram schematically showing a plan layout of a TEG according to a third preferred embodiment of the present invention. In FIG. 24, test electrode pads TPa through TPd are placed in alignment in a single row in a manner similar to the second preferred embodiment. Capacitive elements CP1 and CP2 are respectively placed in areas lying directly below the test electrode pads TPb and TPc as a TEG. The capacitive element CP1 has electrode wirings PL1 and PL2 having comb's tooth portions. These comb's tooth portions are disposed so as to engage with each other. The electrode wirings PL1 and PL2 are respectively configured of a first-layer metal wiring and electrically coupled to the test electrode pads TPa and TPc.

The capacitive element CP2 has electrode wirings PL3 and PL4 each formed of a second layer wiring and has comb's tooth portions disposed opposite to each other in a manner similar to the above capacitive element.

These capacitive elements CP1 and CP2 respectively form capacitances at the comb tooth portions of the same wiring layer, which are disposed opposite to each other. Forming the electrode wirings PL1, PL2, PL3 and PL4 in the comb's tooth-like fashion makes it possible to increase opposite areas of capacitive element electrodes and realize required capacitance values.

In the electrode wirings PL1 through PL4 of these capacitive elements, the comb's tooth portions thereof are coupled to continuously-formed rectangular areas and electrically coupled to their corresponding island-like metal portions of test electrode pads in the rectangular areas. Thus, sectional structures of these electrode wirings PL1 through PL4 become the same as the sectional structures shown in FIGS. 15 through 18.

These electrode wirings PL1, PL2, PL3 and PL4 are formed using the same process as the process of manufacturing a semiconductor device on each semiconductor chip in a manner similar to the first preferred embodiment.

Since the electrodes of the capacitive elements CP1 and CP2 are electrically coupled to their corresponding test electrode pads adjacent to the test electrode pads at which the capacitive elements CP1 and CP2 are respectively disposed, the electrical characteristics or the like of the capacitive elements CP1 and CP2 can be measured in a manner similar to the first preferred embodiment.

Modification

Figure 25:
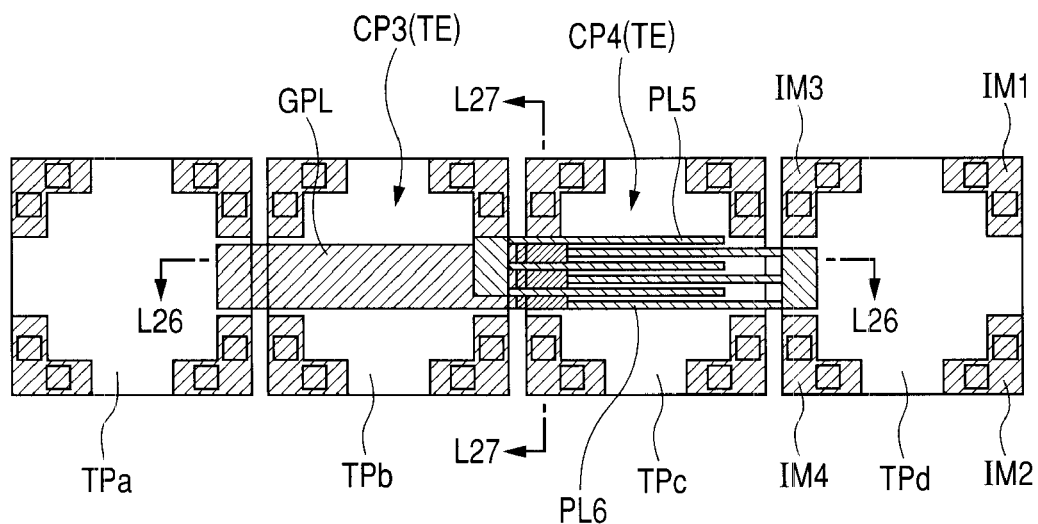
FIG. 25 is a diagram schematically illustrating a plan layout of a TEG according to a modification of the third preferred embodiment of the present invention.

FIG. 25 is a diagram schematically showing a plan layout of a modification of the third preferred embodiment of the present invention. Even in the modification shown in FIG. 25, capacitive elements CP3 and CP4 are disposed as a TEG. A plan layout illustrative of the capacitive elements CP3 and CP4 shown in FIG. 25 is different from the plan layout of the TEG shown in FIG. 24 in terms of the following points. That is, the capacitive element CP3 has an electrode which has an electrode wiring GPL formed by a plate-like polysilicon wiring, and an electrode wiring configured by an active region AR shown in FIG. 26 subsequent to being formed in the surface of each semiconductor chip. These electrode wiring GPL and active region AR are disposed opposite to each other through an unillustrated gate insulating film interposed therebetween. The gate insulating film is used as a capacitance insulating film.

In the capacitive element CP4, its electrode wirings PL5 and PL6 are respectively formed of a first-layer metal wiring and have comb's tooth portions disposed so as to engage with each other in a manner similar to the third preferred embodiment. Capacitance is formed at the comb's tooth portions disposed opposite to each other.

The plan layout shown in FIG. 25 is identical in other arrangement to the plan layout shown in FIG. 24. The same reference numerals are respectively attached to their corresponding portions and their detailed explanations are omitted.

Figure 26:
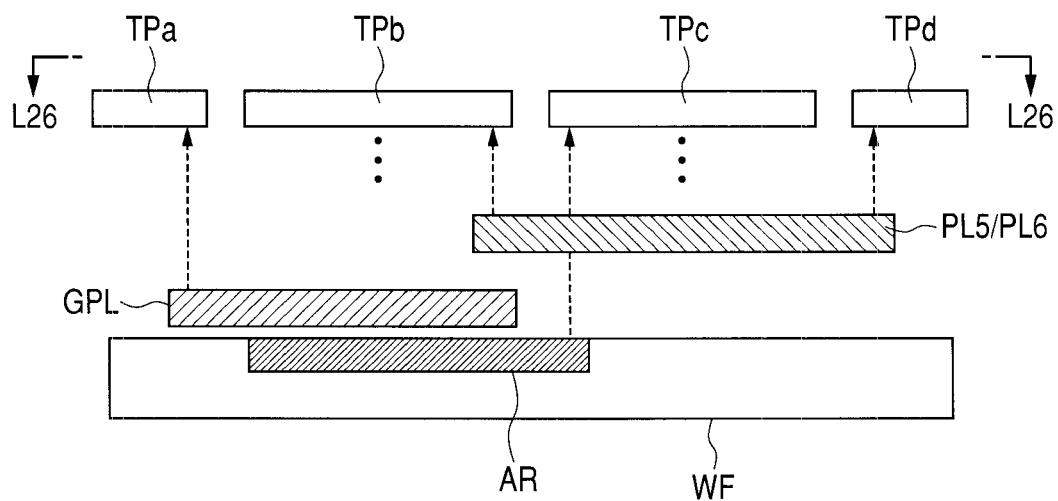
FIG. 26 is a diagram schematically showing a sectional structure taken along line L26-L26 shown in FIG. 25.

FIG. 26 is a diagram schematically showing a sectional structure taken alone line L26-L26 shown in FIG. 25. In FIG. 26, the active region (impurity region) AR is formed in the surface of a scribe region or area of a semiconductor wafer WF. A polysilicon electrode wiring GPL is disposed on the surface of the active region AR through an unillustrated gate insulating film. The polysilicon electrode wiring GPL is formed in the same manufacturing process as the process of forming a gate electrode of a MOS transistor (insulated gate field effect transistor) of a semiconductor device formed on each semiconductor chip CH. The active region is formed in the same manufacturing process as the process of forming the source and drain of the MOS transistor.

The polysilicon electrode wiring GPL is electrically coupled to its corresponding test electrode pad TPa through the island-like metal portion of the test electrode pad TPa as indicated by a broken line. The active region AR is electrically coupled to its corresponding test electrode pad TPc through the corresponding island-like metal portion indicated by a broken line.

The electrode wirings PL5 and PL6 of the capacitive element CP4 are respectively formed of the first-layer metal wiring of the same layer and are electrically coupled to their corresponding test electrode pads TPb and TPd through the island-like metal portions indicated by broken lines.

Figure 27:
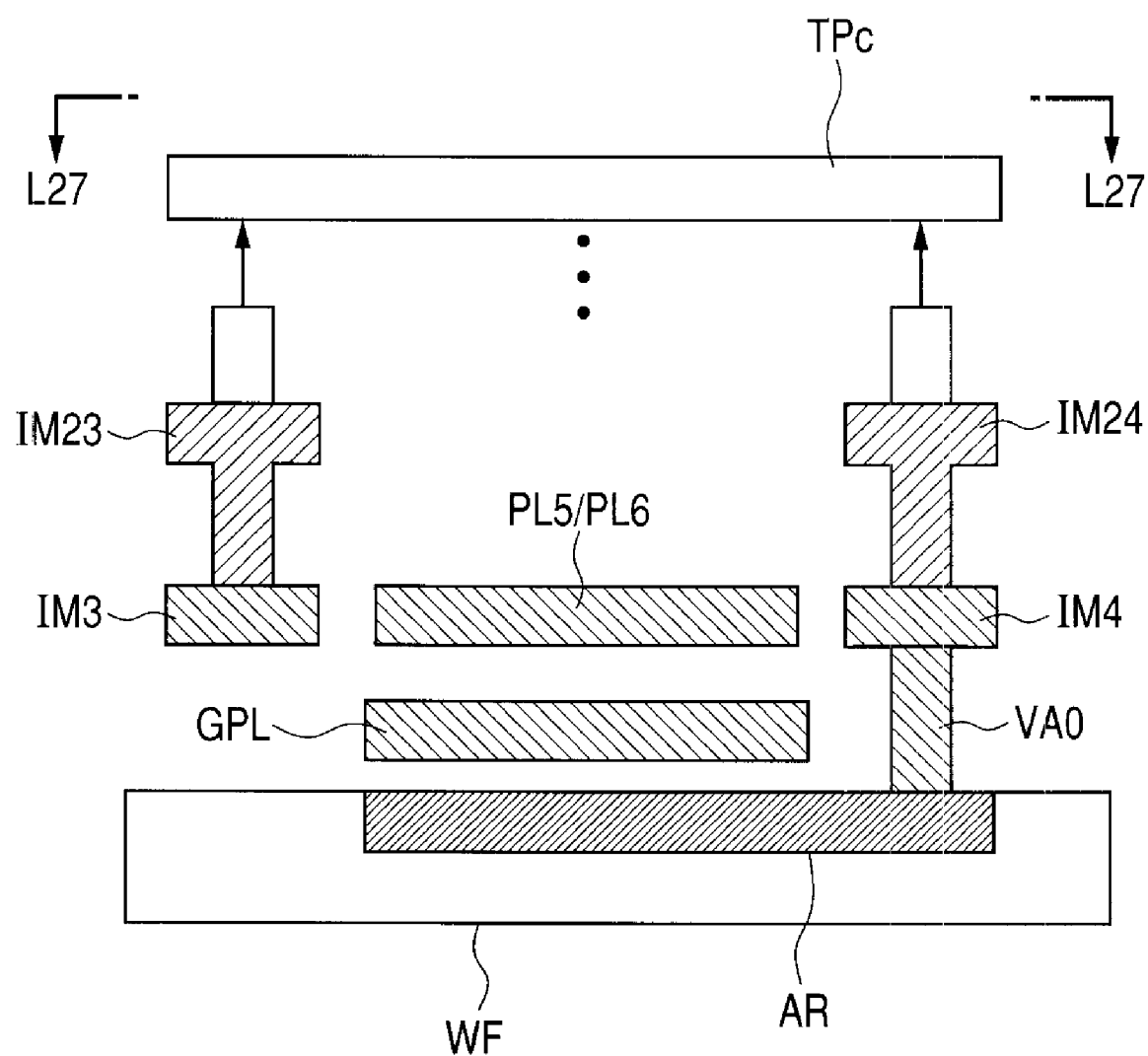
FIG. 27 is a diagram schematically showing a sectional structure taken along line L27-L27 shown in FIG. 25.

FIG. 27 is a diagram schematically showing a sectional structure taken along line L27-L27 shown in FIG. 25. In FIG. 27, the active region AR formed in the surface of the wafer WF is electrically coupled to its corresponding first-layer island-like metal portion IM4 through a via (tungsten plug) VA0. The first-layer island-like metal portion IM4 is electrically coupled to its corresponding test electrode pad TPc through a via and a second-layer island-like metal portion IM24, and an island-like metal portion and a via lying in an upper layer. Electrode wirings PL5 and PL6 of a capacitive element CP2 formed by a first-layer metal wiring are disposed between the first-layer island-like metal portions IM3 and IM4. A polysilicon electrode wiring GPL is placed between the electrode wirings PL5 and PL6 and the active region AR.

The capacitive element CP3 is formed at a portion where the polysilicon electrode wiring GPL and the active region AR overlap as viewed on a plane basis. Thus, the active region AR does not exert an influence on the capacitive value of the capacitive element CP3 in particular even if the width is formed wide below the test electrode pad TPc.

Incidentally, while a sectional structure of an electrically-coupled portion between the test electrode pads TPb and TPd with respect to the electrode wirings PL5 and PL6 of the capacitive element CP4 is not shown, they are electrically coupled to their corresponding test electrode pads by the layout similar to the sectional structure shown in FIG. 22.

Incidentally, although the active region AR is shown so as to be electrically coupled to the first-layer island-like metal portion IM4 in the sectional structure shown in FIG. 27, the active region AR may be disposed so as to be electrically coupled to both the first-layer island-like metal portions IM3 and IM4.

According to the third preferred embodiment of the present invention as described above, the resistive elements are disposed as the test elements and placed at the portions directly below the test electrode pads respectively. They are coupled to their corresponding adjoining test electrode pads by the wirings different in wiring layer. Thus, the resistive elements can be placed in a high density corresponding to the respective test electrode pads at the TEG, and an advantageous effect similar to the first preferred embodiment can be obtained.

Incidentally, the first, second and third preferred embodiments may be utilized in combination suitably, and the transistor elements, capacitive elements and resistive elements may respectively be disposed below the different test electrode pads. For example, the test elements TEo and TEe shown in FIG. 13 may be a transistor element and a capacitive element respectively. As one example, each resistive element may be configured by the upper metal wiring, and the lower metal wiring or polysilicon wiring may be disposed as a capacitive element electrode.

Fourth Preferred Embodiment

Figure 28:
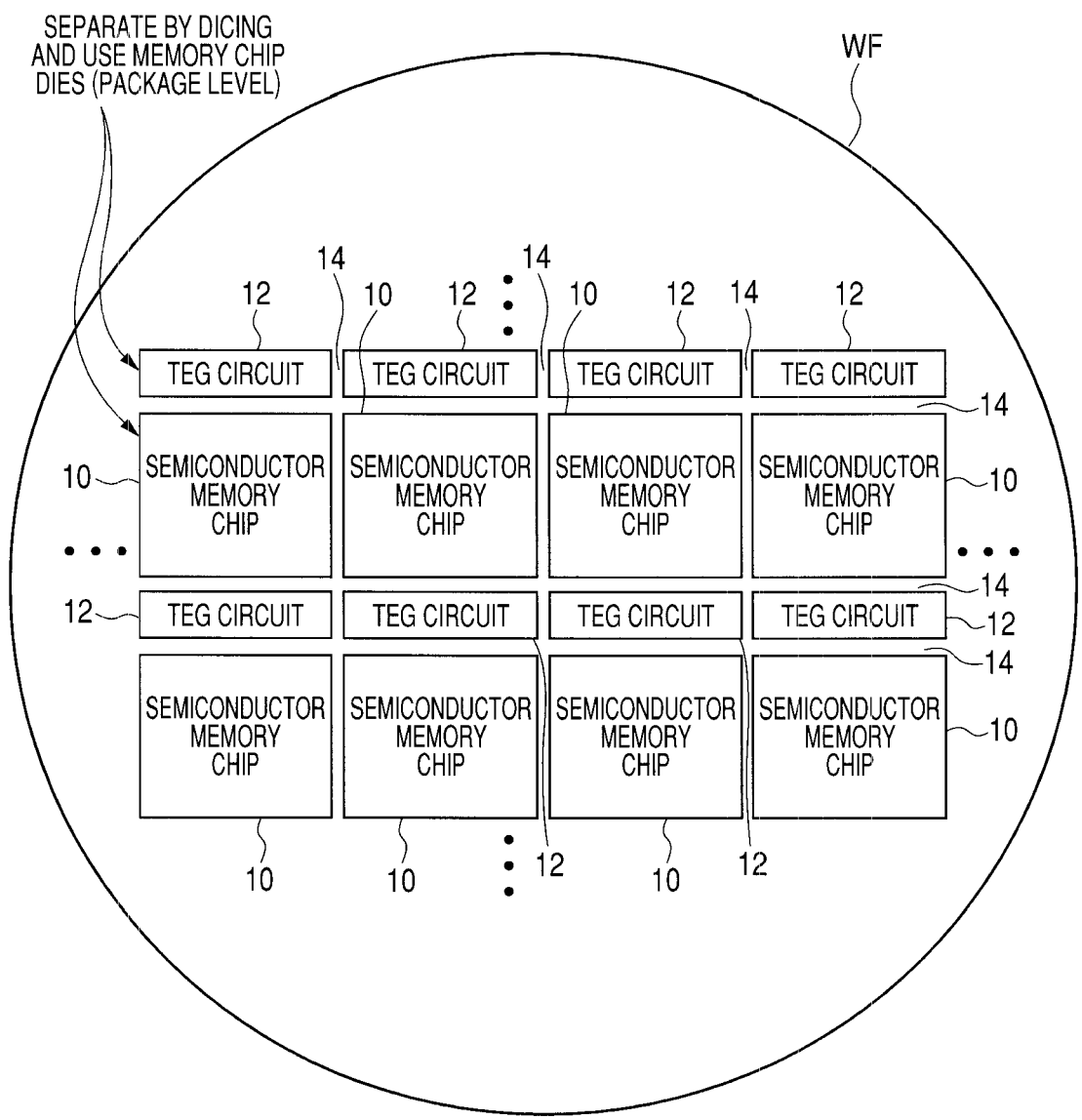
FIG. 28 is a diagram schematically illustrating a chip layout on a semiconductor wafer according to a fourth preferred embodiment of the present invention.

FIG. 28 is a diagram schematically showing a layout of die areas lying on a semiconductor wafer according to a fourth preferred embodiment of the present invention. In FIG. 28, semiconductor memory chips 10 are arranged in array form. TEG circuits 12 are provided corresponding to the semiconductor memory chips 10 respectively. Scribe lines 14 are respectively provided between the semiconductor memory chips 10, between the TEG circuits 12 and between the TEG circuits 12 and the semiconductor memory chips 10. The semiconductor memory chips 10 and the TEG circuits 12 are separated from one another by dicing along the scribe lines 14 after the completion of a test process. Only the semiconductor memory chips 10 are mounted in packages as chip dies respectively. The TEG circuits 12 are not utilized after the dicing. The reliability of each semiconductor memory chip 10 is evaluated using a TEG contained in each TEG circuit 12 upon a test process at a wafer level.

The TEG circuit 12 is of, for example, a circuit TEG (circuit TEG such as a DRAM circuit or an SRAM circuit) set as a reliability evaluation TEG rather than a functional block evaluation TEG (DRAM, SRAM or the like) at a circuit characteristic evaluation and may contain other transistors/ resistors.

When the number of evaluation management items of each semiconductor memory chip 10 increases, an area for laying out a dedicated TEG circuit 12 in an area different from each scribe line is provided outside the semiconductor memory chip 10. The placement of test elements and test electrode pads within each TEG circuit 12 is similar to the previous first and second preferred embodiments. Thus, the areas for laying out the dedicated TEG circuit 12 are provided at their corresponding positions different from the areas in which the semiconductor memory chips 10 are disposed, thereby making it possible to generate a number of test patterns and evaluate the semiconductor memory chips 10.

Incidentally, the TEG circuits 12 for the semiconductor memory chips 10 are illustrated in FIG. 28 by way of example. Each of the semiconductor memory chips may be a semiconductor chip in which logic and memories are mixed, as in the case of, for example, a system-on-chip (SOC) or the like. The semiconductor memory chip may be a chip formed with logic, such as another processor. The semiconductor chip 10 may be such a semiconductor chip that management items are large in number and measurements thereof are made using a TEG of each TEG circuit to evaluate reliability or the like thereof.

The layout of the TEG in each TEG circuit 12, its test process and its manufacturing process according to the fourth preferred embodiment of the present invention are identical to ones described in the previous first preferred embodiment.

According to the fourth preferred embodiment of the present invention as described above, the dedicated TEG circuit areas are provided in their corresponding areas different from the areas in which the semiconductor chips are disposed. Hence, the test patterns can be formed in large numbers and the reliability of the evaluation of the semiconductor device formed in each semiconductor chip can be enhanced. Even if the number of the test patterns increases, the test elements are disposed corresponding to the test electrode pads and their tests are conducted in a manner similar to the first preferred embodiment. It is therefore possible to reduce the exclusively-possessed area of each TEG circuit at the time of the increase in the test pattern. Correspondingly, the semiconductor chips formed with the target semiconductor devices made available for actual use on the semiconductor chips can be laid out with high efficiency of area utilization, thus making it possible to suppress an increase in chip cost.

The present invention can generally be applied to semiconductor devices each evaluated using a TEG in a semiconductor wafer, and a test method thereof.

What is claimed is:

1. A manufacturing method of a semiconductor device, comprising:
    a first step of forming a plurality of test elements in alignment in one row in predetermined areas positioned in areas different from semiconductor chips formed with target circuit devices arranged over a semiconductor wafer;
    a second step of forming a plurality of test electrode pads in alignment in one row in layers above the test elements so as to correspond to the test elements and overlap with the test elements as viewed on a plane basis; and
    a third step of electrically coupling the test elements to the corresponding test electrode pads each adjacent to both sides of the test electrode pad placed directly above the test element.

2. The method according to claim 1, wherein the predetermined areas are of test areas disposed adjacent to one another through scribe lines for cutting of the semiconductor chips.

3. The method according to claim 1, wherein the predetermined areas are of areas in which scribe lines for separating the semiconductor chips are formed.

4. The method according to claim 1,
    wherein the second step includes a step of forming the test electrode pads by an aluminum wiring corresponding to a top layer of metal wiring layers,
    further including a fourth step, performed between the second step and the third step, of forming a plurality of metal portions separated from one another in island-like form using copper wirings, in layers below the test electrode pads and layers above the test elements, and
    wherein the third step is of a test for electrically coupling the metal portions to their corresponding test electrode pads through vias.

5. The method according to claim 4, wherein the third step includes a step of forming wirings passing between the metal portions disposed corresponding to the corresponding test electrode pads and electrically coupling the test elements to the adjoining test electrode pads.

6. The method according to claim 4,
    wherein the top layer is a Kth wiring layer,
wherein the test elements are of transistors formed in a lower layer below a (K−3)th layer, and
    wherein the step of electrically coupling the test elements to the test electrode pads respectively includes a step of forming wirings so as to pass between the metal portions corresponding to the test electrode pads disposed with the transistors being adjacent to both sides of each corresponding test electrode pad and for electrically coupling the same.

7. The method according to claim 1,
    wherein each of the test elements is of a four-terminal element having first through fourth terminals, and
    wherein the third step includes a step of coupling first and second terminals to the adjoining test electrode pads, respectively, arranged on both sides of each corresponding test electrode pad for each transistor and coupling third and fourth terminals to test electrode pads adjacent to the adjoining test electrode pads of both sides with respectively being further one test electrode pad interposed therebetween.

8. The method according to claim 1,
wherein the test elements are of wiring resistances,
wherein the second step includes a step of forming wirings of each wiring layer different from the top layer in such a manner that metal portions provided for the adjoining test electrode pads are short-circuited, thereby forming the wiring resistances, and
wherein wiring resistances disposed corresponding to the test electrode pads disposed adjacent to each other are formed using wirings of wiring layers different from each other.

9. The method according to claim 1,
wherein the test elements are of capacitive elements,
wherein the second step includes a step of forming first and second wirings of wiring layers different from the top layer so as to be electrically coupled to metal portions provided for the adjacent test electrode pads respectively thereby to form the wiring resistances,
wherein the first and second wirings have portions separated from each other and disposed opposite to each other, and
wherein capacitive elements disposed corresponding to the test electrode pads disposed adjacent to each other are formed using wirings of wiring layers different from each other.

10. The method according to claim 1,
wherein the test elements are of capacitive elements,
wherein the second step includes a step of forming wirings of wiring layers different from the top layer in such a manner that metal portions provided for the adjoining test electrode pads are short-circuited, thereby forming first electrodes of the capacitive elements,
wherein the first step includes a step of forming an active region in the predetermined area at a layer below each of the first electrodes and opposite to the first electrode, and
wherein capacitive elements disposed corresponding to the test electrode pads disposed adjacent to each other are formed using wirings of wiring layers different from each other.

11. The method according to claim 1, wherein the third step includes a step of electrically coupling the test elements disposed below the adjoining test electrode pads to their corresponding test electrode pads adjacent to electrode pads directly placed thereover using wirings of wiring layers different from each other.

12. A semiconductor wafer formed by a method according to claim 1.

13. A test method for conducting a test on a semiconductor device, comprising the steps of:
(a) providing a semiconductor device formed by a method including:
(a1) a first step of forming a plurality of test elements in alignment in one row in predetermined areas positioned in areas different from semiconductor chips formed with target circuit devices arranged over a semiconductor wafer;
(a2) a second step of forming a plurality of test electrode pads in alignment in one row in layers above the test elements so as to correspond to the test elements and overlap with the test elements as viewed on a plane basis; and
(a3) a third step of electrically coupling the test elements to the corresponding test electrode pads each adjacent to both sides of the test electrode pad placed directly above the test element;
(b) causing test probe pins to make contact with the alternate electrode pads of the test electrode pads and performing transmission/reception of an electric signal between a tester and the alternate electrode pads thereby to conduct a test; and
(c) causing the test probe pins to contact the corresponding test electrode pads with being shifted by one test electrode pad and performing transmission/reception of an electric signal between the tester and the electrode pads brought into contact therewith thereby to conduct a test.

14. A semiconductor wafer comprising:
a plurality of test electrode pads disposed in alignment in one row; and
a plurality of test elements formed with corresponding electrode pad overlaps so as to correspond to the test electrode pads in alignment and overlap with the corresponding test electrode pads as viewed on a plane basis, and disposed in such a manner that the test elements different from each other are electrically coupled to the adjoining electrode pads of the test electrode pads and the respective test elements are coupled to the test electrode pads different from the corresponding test electrode pads provided directly thereabove.

15. The semiconductor wafer according to claim 14, wherein the adjoining test elements disposed corresponding to the adjoining test electrode pads are alternately electrically coupled to the test electrode pads disposed continuously at the test electrode pads.

16. A manufacturing method of a semiconductor device, comprising the steps of:
(a) providing a semiconductor wafer including:
(a1) a plurality of test electrode pads disposed in alignment in one row; and
(a2) a plurality of test elements formed with corresponding electrode pad overlaps so as to correspond to the test electrode pads in alignment and overlap with the corresponding test electrode pads as viewed on a plane basis, and disposed in such a manner that the test elements different from each other are electrically coupled to the adjoining electrode pads of the test electrode pads and the respective test elements are coupled to the test electrode pads different from the corresponding test electrode pads provided directly thereabove;
(b) causing a test probe for transmission/reception of an electric signal to and from a tester to contact the test electrode pads disposed at alternate intervals of the test electrode pads, thereby conducting a test, and
(c) causing the test probe for the transmission/reception of the electric signal to and from the tester to contact the test electrode pads disposed at the alternate intervals while the test electrode pads are being shifted by one, thereby conducting a test.

* * * * *